US010662527B2

(12) United States Patent
Marquardt

(10) Patent No.: US 10,662,527 B2
(45) Date of Patent: May 26, 2020

(54) MANIFOLDS FOR UNIFORM VAPOR DEPOSITION

(71) Applicant: ASM IP HOLDING B.V., Almere (NL)

(72) Inventor: David Marquardt, Scottsdale, AZ (US)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 15/170,639

(22) Filed: Jun. 1, 2016

(65) Prior Publication Data

US 2017/0350011 A1 Dec. 7, 2017

(51) Int. Cl.
| C23C 16/455 | (2006.01) |
| H01L 21/02 | (2006.01) |
| H01L 21/285 | (2006.01) |

(52) U.S. Cl.
CPC .. *C23C 16/45544* (2013.01); *C23C 16/45561* (2013.01); *C23C 16/45576* (2013.01); *H01L 21/0262* (2013.01); *H01L 21/28556* (2013.01)

(58) Field of Classification Search
CPC ................ B01F 2003/04283; B01F 2003/04319–04326; B01F 2005/0002–0008; B01F 2005/0014; B01F 2005/0037; B01F 2005/004–0048; B01F 2005/0051; B01F 3/02–028; B01F 3/04241; B01F 3/04248; B01F 3/0446; B01F 3/04496; B01F 5/0057–0065; B01F 5/02–0212; B01F 5/04–0403;
(Continued)

(56) References Cited

U.S. PATENT DOCUMENTS

| 1,523,156 A * | 1/1925 | Adams ................ F24H 1/121 |
| | | 392/479 |
| 1,853,045 A * | 4/1932 | Gnau ................ B01F 5/0415 |
| | | 261/76 |

(Continued)

FOREIGN PATENT DOCUMENTS

| DE | 3715644 | 12/1988 |
| JP | H09-186111 | 7/1997 |

(Continued)

OTHER PUBLICATIONS

Office Action for Chinese Patent Application No. 200780002793.9, dated Mar. 15, 2010.
(Continued)

*Primary Examiner* — Jeffrie R Lund
*Assistant Examiner* — Stanislav Antolin
(74) *Attorney, Agent, or Firm* — Knobbe, Martens, Olson & Bear LLP

(57) ABSTRACT

A semiconductor device comprising a manifold for uniform vapor deposition is disclosed. The semiconductor device can include a manifold comprising a bore and having an inner wall. The inner wall can at least partially define the bore. A first axial portion of the bore can extend along a longitudinal axis of the manifold. A supply channel can provide fluid communication between a gas source and the bore. The supply channel can comprise a slit defining an at least partially annular gap through the inner wall of the manifold to deliver a gas from the gas source to the bore. The at least partially annular gap can be revolved about the longitudinal axis.

22 Claims, 25 Drawing Sheets

(58) Field of Classification Search
CPC .............. B01F 5/0413; B01F 5/0418; B01F 5/0421–0423; B01F 5/0453; B01F 5/0456; B01F 5/0461–0466; B01F 5/0493; B01F 5/0646–0655; B01F 7/0016; B05B 7/04–0475; B05B 7/0483; B05B 7/0491; B05B 7/08–0815; C23C 16/455; C23C 16/45502; C23C 16/45512–45517; C23C 16/45525–45555; C23C 16/45561; C23C 16/45563; C23C 16/45574; C23C 16/458; H01J 37/3244; H01J 37/32449; H01J 21/0228; H01J 21/02; H01J 21/285
See application file for complete search history.

(56) References Cited

U.S. PATENT DOCUMENTS

| | | | |
|---|---|---|---|
| 3,882,934 A * | 5/1975 | Knoos | F28D 9/04 165/164 |
| 3,913,617 A * | 10/1975 | van Laar | B01F 5/0471 137/599.01 |
| 4,222,671 A * | 9/1980 | Gilmore | B01F 5/0604 366/337 |
| 4,401,052 A | 8/1983 | Baron et al. | |
| 4,410,281 A * | 10/1983 | Crookes | B01F 5/0646 138/178 |
| 4,422,773 A * | 12/1983 | Cassaday | B01F 5/0646 366/341 |
| 4,649,859 A * | 3/1987 | Wanlass | C23C 16/455 118/715 |
| 4,747,367 A | 5/1988 | Posa | |
| 4,828,224 A | 5/1989 | Crabb et al. | |
| 4,869,284 A * | 9/1989 | Scott | C23C 16/45561 137/100 |
| 4,889,609 A | 12/1989 | Cannella | |
| 4,895,107 A | 1/1990 | Yano et al. | |
| 4,907,534 A | 3/1990 | Huang et al. | |
| 4,949,783 A | 8/1990 | Lakios et al. | |
| 4,951,601 A | 8/1990 | Maydan et al. | |
| 4,990,047 A | 2/1991 | Wagner et al. | |
| 5,004,374 A * | 4/1991 | Grey | F28D 7/08 405/154.1 |
| 5,071,460 A | 12/1991 | Fujiura et al. | |
| 5,080,549 A | 1/1992 | Goodwin et al. | |
| 5,106,453 A * | 4/1992 | Benko | C23C 16/455 117/104 |
| 5,121,705 A | 6/1992 | Sugino | |
| 5,131,627 A * | 7/1992 | Kolenc | F16K 41/12 251/331 |
| 5,166,092 A | 11/1992 | Mochizuki et al. | |
| 5,186,718 A | 2/1993 | Tepman et al. | |
| 5,192,371 A | 3/1993 | Shuto et al. | |
| 5,199,483 A | 4/1993 | Bahng | |
| 5,217,501 A | 6/1993 | Fuse et al. | |
| 5,223,001 A | 6/1993 | Saeki | |
| 5,229,615 A | 7/1993 | Brune et al. | |
| 5,248,253 A | 9/1993 | Philipossian et al. | |
| 5,252,131 A * | 10/1993 | Kiyama | C23C 16/44 118/719 |
| 5,284,519 A | 2/1994 | Gadgil | |
| 5,286,296 A | 2/1994 | Sato et al. | |
| 5,288,327 A * | 2/1994 | Bhat | C23C 16/4584 117/102 |
| 5,350,453 A | 9/1994 | Scholosser | |
| 5,388,944 A | 2/1995 | Takanabe et al. | |
| 5,391,035 A | 2/1995 | Krueger | |
| 5,405,446 A * | 4/1995 | Nakajima | C23C 16/45504 118/715 |
| 5,433,785 A | 7/1995 | Saito | |
| 5,462,397 A | 10/1995 | Iwabuchi | |
| 5,488,925 A | 2/1996 | Kumada | |
| 5,516,732 A | 5/1996 | Flegal | |
| 5,520,742 A | 5/1996 | Ohkase | |
| 5,520,743 A | 5/1996 | Takahashi | |
| 5,538,390 A | 7/1996 | Salzman | |
| 5,571,330 A | 11/1996 | Kyogoku | |
| 5,586,585 A | 12/1996 | Bonora et al. | |
| 5,601,651 A | 2/1997 | Watabe | |
| 5,609,459 A | 3/1997 | Muka | |
| 5,728,223 A | 3/1998 | Murakami et al. | |
| 5,755,878 A | 5/1998 | Habuka et al. | |
| 5,789,027 A | 8/1998 | Watkins et al. | |
| 5,846,330 A * | 12/1998 | Quirk | C23C 16/4558 118/723 DC |
| 5,851,294 A * | 12/1998 | Young | C23C 16/45508 118/715 |
| 5,885,358 A * | 3/1999 | Maydan | C23C 16/455 118/715 |
| 5,893,641 A * | 4/1999 | Garcia | B01F 5/0413 137/888 |
| 5,938,840 A | 8/1999 | Habuka et al. | |
| 5,951,771 A * | 9/1999 | Raney | C23C 16/4551 118/723 ER |
| 6,036,783 A | 3/2000 | Fukunaga et al. | |
| 6,070,550 A | 6/2000 | Ravi et al. | |
| 6,079,353 A | 6/2000 | Leksell et al. | |
| 6,114,227 A | 9/2000 | Leksell et al. | |
| 6,217,658 B1 * | 4/2001 | Orczyk | C03C 3/06 118/697 |
| 6,224,676 B1 | 5/2001 | Nakajima et al. | |
| 6,299,692 B1 | 10/2001 | Ku et al. | |
| 6,302,965 B1 | 10/2001 | Umotoy et al. | |
| 6,303,501 B1 | 10/2001 | Chen et al. | |
| 6,331,072 B1 * | 12/2001 | Schierholz | B01F 5/0646 366/338 |
| 6,375,750 B1 * | 4/2002 | van Os | C23C 16/4405 118/500 |
| 6,416,213 B1 * | 7/2002 | Fukunaga | B01D 21/01 366/158.5 |
| 6,534,133 B1 | 3/2003 | Kaloyeros et al. | |
| 6,660,177 B2 | 12/2003 | Carr | |
| 6,783,590 B2 | 8/2004 | Lindfors et al. | |
| 6,846,516 B2 | 1/2005 | Yang et al. | |
| 6,881,263 B2 | 4/2005 | Lindfors et al. | |
| 6,884,296 B2 | 4/2005 | Basceri et al. | |
| 6,899,507 B2 | 5/2005 | Yamagishi et al. | |
| 6,905,547 B1 | 6/2005 | Londergan et al. | |
| 6,916,398 B2 | 7/2005 | Chen et al. | |
| 7,018,478 B2 | 3/2006 | Lindfors et al. | |
| 7,021,881 B2 | 4/2006 | Yamagishi et al. | |
| 7,045,060 B1 * | 5/2006 | Liles | B01F 3/0861 210/199 |
| 7,163,587 B2 | 1/2007 | Kinnard et al. | |
| 7,175,713 B2 | 2/2007 | Thakur et al. | |
| 7,195,037 B2 | 3/2007 | Eidsmore | |
| 7,204,886 B2 | 4/2007 | Chen et al. | |
| 7,297,892 B2 | 11/2007 | Kelley et al. | |
| 7,304,263 B2 | 12/2007 | Chang et al. | |
| 7,311,851 B2 | 12/2007 | Carr | |
| 7,402,210 B2 | 7/2008 | Chen et al. | |
| 7,408,225 B2 | 8/2008 | Shinriki et al. | |
| 7,591,907 B2 | 9/2009 | Chen et al. | |
| 7,591,957 B2 | 9/2009 | Carr | |
| 7,670,399 B2 | 3/2010 | Park | |
| 7,780,785 B2 | 8/2010 | Chen et al. | |
| 7,780,789 B2 | 8/2010 | Wu et al. | |
| 7,846,499 B2 | 12/2010 | Blomberg | |
| 7,918,938 B2 | 4/2011 | Provencher et al. | |
| 8,070,879 B2 | 12/2011 | Chen et al. | |
| 8,137,463 B2 | 3/2012 | Liu et al. | |
| 8,152,922 B2 | 4/2012 | Schmidt et al. | |
| 8,211,230 B2 | 7/2012 | Verghese et al. | |
| 8,298,336 B2 | 10/2012 | Wang et al. | |
| 8,372,201 B2 | 2/2013 | Provencher et al. | |
| 8,425,682 B2 | 4/2013 | Wang et al. | |
| 8,465,801 B2 | 6/2013 | Schmidt et al. | |
| 8,668,776 B2 | 3/2014 | Chen et al. | |
| 8,784,563 B2 | 7/2014 | Schmidt et al. | |
| 9,388,492 B2 | 7/2016 | White et al. | |
| 9,574,268 B1 * | 2/2017 | Dunn | H05H 1/46 156/345.33 |

(56) References Cited

U.S. PATENT DOCUMENTS

| | | | |
|---|---|---|---|
| 10,147,597 B1* | 12/2018 | Lee | H01L 21/02104 |
| 2001/0003015 A1 | 6/2001 | Chang et al. | |
| 2001/0006093 A1 | 7/2001 | Tabuchi et al. | |
| 2002/0007790 A1 | 1/2002 | Park | |
| 2002/0072164 A1 | 6/2002 | Umotoy et al. | |
| 2002/0081381 A1 | 6/2002 | DelaRosa et al. | |
| 2002/0113327 A1* | 8/2002 | Hara | B01F 5/0415 261/76 |
| 2002/0170674 A1* | 11/2002 | Shapiro | C23C 16/4412 156/345.33 |
| 2002/0195055 A1 | 12/2002 | Grant et al. | |
| 2003/0010451 A1 | 1/2003 | Tzu et al. | |
| 2003/0019428 A1 | 1/2003 | Ku et al. | |
| 2003/0056720 A1 | 3/2003 | Dauelsberg et al. | |
| 2003/0070620 A1 | 4/2003 | Cooperberg et al. | |
| 2003/0079686 A1 | 5/2003 | Chen et al. | |
| 2003/0101938 A1 | 6/2003 | Ronsse et al. | |
| 2003/0106643 A1 | 6/2003 | Tabuchi et al. | |
| 2003/0172872 A1 | 9/2003 | Thakur et al. | |
| 2003/0180460 A1 | 9/2003 | Strauch et al. | |
| 2003/0194360 A1* | 10/2003 | Huziwara | B01F 5/205 422/219 |
| 2003/0205096 A1* | 11/2003 | Gehner | B01F 3/02 73/863 |
| 2004/0028810 A1 | 2/2004 | Grant et al. | |
| 2004/0035358 A1 | 2/2004 | Basceri et al. | |
| 2004/0113289 A1* | 6/2004 | Toda | B01B 1/005 261/78.2 |
| 2004/0118342 A1 | 6/2004 | Cheng et al. | |
| 2004/0144311 A1* | 7/2004 | Chen | C23C 16/45502 118/715 |
| 2004/0197090 A1* | 10/2004 | Kudo | F24H 7/0408 392/341 |
| 2004/0217217 A1* | 11/2004 | Han | C23C 16/4558 239/589 |
| 2005/0000428 A1 | 1/2005 | Shero et al. | |
| 2005/0000656 A1 | 1/2005 | Carr | |
| 2005/0009325 A1 | 1/2005 | Chung et al. | |
| 2005/0092247 A1 | 5/2005 | Schmidt et al. | |
| 2005/0173068 A1 | 8/2005 | Chen et al. | |
| 2005/0208217 A1 | 9/2005 | Shinriki et al. | |
| 2005/0252449 A1 | 11/2005 | Nguyen et al. | |
| 2005/0263197 A1 | 12/2005 | Eidsmore | |
| 2005/0271812 A1 | 12/2005 | Myo et al. | |
| 2006/0053833 A1* | 3/2006 | Martins | F25B 39/04 62/507 |
| 2006/0096540 A1 | 5/2006 | Choi | |
| 2006/0266289 A1 | 11/2006 | Verghese et al. | |
| 2007/0001326 A1* | 1/2007 | Toda | C23C 16/4481 261/155 |
| 2007/0026147 A1 | 2/2007 | Chen et al. | |
| 2007/0095285 A1 | 5/2007 | Thakur et al. | |
| 2007/0128864 A1 | 6/2007 | Ma et al. | |
| 2007/0187634 A1* | 8/2007 | Sneh | F16K 7/14 251/30.01 |
| 2007/0194470 A1* | 8/2007 | Dedontney | B01F 3/022 261/76 |
| 2008/0037968 A1* | 2/2008 | Kaastra | F24H 1/121 392/465 |
| 2008/0085226 A1 | 4/2008 | Fondurulia et al. | |
| 2008/0102203 A1 | 5/2008 | Wu et al. | |
| 2008/0102208 A1 | 5/2008 | Wu et al. | |
| 2008/0115740 A1* | 5/2008 | You | D06F 39/008 122/235.14 |
| 2008/0162580 A1 | 7/2008 | Ben Harush | |
| 2008/0202416 A1 | 8/2008 | Provencher et al. | |
| 2008/0271610 A1* | 11/2008 | Vedsted | F25D 13/06 99/352 |
| 2009/0095222 A1* | 4/2009 | Tam | C23C 16/34 118/723 R |
| 2009/0196992 A1 | 8/2009 | Schmidt et al. | |
| 2009/0215912 A1* | 8/2009 | Goto | B01J 3/00 521/40 |
| 2009/0320754 A1* | 12/2009 | Oya | C23C 16/455 118/715 |
| 2010/0003406 A1 | 1/2010 | Lam et al. | |
| 2010/0024727 A1 | 2/2010 | Kim et al. | |
| 2010/0048032 A1 | 2/2010 | Sangam et al. | |
| 2010/0092163 A1* | 4/2010 | Yeung | F24H 1/106 392/441 |
| 2010/0150756 A1* | 6/2010 | Chow | F04F 7/00 417/416 |
| 2010/0266765 A1 | 10/2010 | White et al. | |
| 2010/0296800 A1* | 11/2010 | Min | F24H 1/121 392/468 |
| 2010/0310772 A1 | 12/2010 | Tsuda | |
| 2011/0098841 A1 | 4/2011 | Tsuda | |
| 2011/0111136 A1* | 5/2011 | Slevin | C23C 16/4402 427/569 |
| 2011/0116776 A1* | 5/2011 | Wheeler | F24H 1/121 392/441 |
| 2011/0128814 A1* | 6/2011 | Hanada | B01F 5/0614 366/339 |
| 2011/0199855 A1* | 8/2011 | Hanada | B01F 5/0646 366/165.1 |
| 2011/0223334 A1* | 9/2011 | Yudovsky | C23C 16/45504 427/255.23 |
| 2012/0079984 A1 | 4/2012 | Schmidt et al. | |
| 2012/0289057 A1* | 11/2012 | DeDontney | C23C 16/45519 438/758 |
| 2013/0058835 A1* | 3/2013 | Salazar-Guillen | B01J 19/26 422/129 |
| 2013/0061759 A1* | 3/2013 | Laor | C23C 16/455 96/306 |
| 2013/0160709 A1 | 6/2013 | White et al. | |
| 2013/0206338 A1* | 8/2013 | Tanaka | H05H 1/46 156/345.33 |
| 2013/0333620 A1* | 12/2013 | Li | C23C 16/45563 118/728 |
| 2014/0261178 A1 | 9/2014 | Du Bois et al. | |
| 2014/0284404 A1* | 9/2014 | Kuah | C23C 16/45565 239/408 |
| 2015/0104161 A1* | 4/2015 | De Mango | F24H 1/102 392/479 |
| 2015/0176126 A1* | 6/2015 | Ge | C23C 16/45574 137/240 |
| 2015/0232355 A1* | 8/2015 | Ghaffour | C02F 1/686 210/754 |
| 2015/0240359 A1* | 8/2015 | Jdira | C02F 1/686 210/754 |
| 2015/0371831 A1* | 12/2015 | Rozenzon | C23C 16/34 118/723 R |
| 2015/0377481 A1* | 12/2015 | Smith | F22B 1/28 392/396 |
| 2016/0222508 A1* | 8/2016 | Schoepp | F22B 1/282 |
| 2016/0281232 A1 | 9/2016 | White et al. | |
| 2017/0121818 A1* | 5/2017 | Dunn | B01F 5/0646 366/165.1 |
| 2017/0350011 A1* | 12/2017 | Marquardt | C23C 16/45544 |

FOREIGN PATENT DOCUMENTS

| | | | | |
|---|---|---|---|---|
| JP | 4667541 B2 * | 4/2011 | | B01F 5/0646 |
| WO | WO 90/10092 | 9/1990 | | |
| WO | WO 01/29282 A2 | 4/2001 | | |
| WO | WO-2010047168 A1 * | 4/2010 | | B01F 5/0646 |
| WO | WO-2014163742 A1 * | 10/2014 | | B01F 5/0646 |

OTHER PUBLICATIONS

Office Action for Chinese Patent Application No. 200780002793.9, dated Apr. 19, 2011.

Notice for Reasons for Rejection dated Feb. 28, 2012 for Japanese Patent Application No. 2008551324, filed Jul. 16, 2008, 5 pages.

* cited by examiner

FIG. 6C

MANIFOLDS FOR UNIFORM VAPOR DEPOSITION

BACKGROUND OF THE INVENTION

Field

The field relates generally to manifolds for uniform vapor deposition, and, in particular, to manifolds for improving reactant mixing in atomic layer deposition (ALD) reactors.

Description of the Related Art

There are several vapor deposition methods for depositing thin films on surfaces of substrates. These methods include vacuum evaporation deposition, Molecular Beam Epitaxy (MBE), different variants of Chemical Vapor Deposition (CVD) (including low-pressure and organometallic CVD and plasma-enhanced CVD), and Atomic Layer Deposition (ALD).

In an ALD process, one or more substrates with at least one surface to be coated are introduced into a deposition chamber. The substrate is heated to a desired temperature, typically above the condensation temperatures of the selected vapor phase reactants and below their thermal decomposition temperatures. One reactant is capable of reacting with the adsorbed species of a prior reactant to form a desired product on the substrate surface. Two, three or more reactants are provided to the substrate, typically in spatially and temporally separated pulses.

In an example, in a first pulse, a first reactant representing a precursor material is adsorbed largely intact in a self-limiting process on a wafer. The process is self-limiting because the vapor phase precursor cannot react with or adsorb upon the adsorbed portion of the precursor. After any remaining first reactant is removed from the wafer or chamber, the adsorbed precursor material on the substrate reacted with a subsequent reactant pulse to form no more than a single molecular layer of the desired material. The subsequent reactant may, e.g., strip ligands from the adsorbed precursor material to make the surface reactive again, replace ligands and leave additional material for a compound, etc. In an unadulterated ALD process, less than a monolayer is formed per cycle on average due to steric hindrance, whereby the size of the precursor molecules prevent access to adsorption sites on the substrate, which may become available in subsequent cycles. Thicker films are produced through repeated growth cycles until the target thickness is achieved. Growth rate is often provided in terms of angstroms per cycle because in theory the growth depends solely on number of cycles, and has no dependence upon mass supplied or temperature, as long as each pulse is saturative and the temperature is within the ideal ALD temperature window for those reactants (no thermal decomposition and no condensation).

Reactants and temperatures are typically selected to avoid both condensation and thermal decomposition of the reactants during the process, such that chemical reaction is responsible for growth through multiple cycles. However, in certain variations on ALD processing, conditions can be selected to vary growth rates per cycle, possibly beyond one molecular monolayer per cycle, by utilizing hybrid CVD and ALD reaction mechanisms. Other variations maybe allow some amount of spatial and/or temporal overlap between the reactants. In ALD and variations thereof, two, three, four or more reactants can be supplied in sequence in a single cycle, and the content of each cycle can be varied to tailor composition.

During a typical ALD process, the reactant pulses, all of which are in vapor form, are pulsed sequentially into a reaction space (e.g., reaction chamber) with removal steps between reactant pulses to avoid direct interaction between reactants in the vapor phase. For example, inert gas pulses or "purge" pulses can be provided between the pulses of reactants. The inert gas purges the chamber of one reactant pulse before the next reactant pulse to avoid gas phase mixing. To obtain a self-limiting growth, a sufficient amount of each precursor is provided to saturate the substrate. As the growth rate in each cycle of a true ALD process is self-limiting, the rate of growth is proportional to the repetition rate of the reaction sequences rather than to the flux of reactant.

SUMMARY

The systems and methods of the present invention have several features, no single one of which is solely responsible for its desirable attributes. Without limiting the scope of this invention as expressed by the claims which follow, various features will now be discussed briefly. After considering this discussion, and particularly after reading the section entitled "Detailed Description," one will understand how the features described herein provide several advantages over traditional gas delivery methods and systems.

In one embodiment, a semiconductor processing device is disclosed. The semiconductor processing device can include a manifold comprising a bore and having an inner wall, the inner wall at least partially defining the bore. A first axial portion of the bore can extend along a longitudinal axis of the manifold. The semiconductor processing device can include a supply channel that provides fluid communication between a gas source and the bore. The supply channel can comprise a slit defining an at least partially annular gap through the inner wall of the manifold to deliver a gas from the gas source to the bore. The at least partially annular gap can be revolved about the longitudinal axis.

In another embodiment, a semiconductor processing device is disclosed. The semiconductor processing device can include a manifold comprising a bore and a supply channel that provides fluid communication between a gas source and the bore to supply a gas to the bore. The bore can comprise a channel having an annular flow portion with an at least partially annular cross-section and a non-annular flow portion with a non-annular cross-section, the non-annular flow portion disposed downstream of the annular flow portion.

In another embodiment, a method of deposition is disclosed. The method can include supplying a gas through a supply channel to a bore of a manifold. The method can include creating an at least partially annular flow pattern in an annular flow portion of the bore such that the gas flows along a longitudinal axis of the manifold with an at least partially annular cross-section. Downstream of the annular flow portion, a non-annular flow pattern can be created in a non-annular portion of the bore such that the gas flows along the longitudinal axis with a non-annular cross-section.

In another embodiment, a method of deposition is disclosed. The method can include supplying a gas to a supply channel. The method can include directing the gas from the supply channel to a bore of a manifold through a slit defining an at least partially annular gap along an inner wall of the manifold, the at least partially annular gap revolved about a longitudinal axis of the manifold.

In another embodiment, a semiconductor processing device is disclosed. The semiconductor processing device can include a manifold comprising a bore therein, the bore defining a gas passageway between a first end portion of the manifold and a second end portion of the manifold. The first end portion can be disposed opposite to and spaced from the second end portion along a longitudinal axis of the manifold by a first distance. The gas passageway can extend through the manifold for a second distance larger than the first distance. A reaction chamber can be disposed downstream of and in fluid communication with the bore.

In another embodiment, a semiconductor processing device is disclosed. The semiconductor processing device can include a manifold comprising a bore having an axial portion that defines a longitudinal axis of the manifold and a lateral portion extending non-parallel to the longitudinal axis. The semiconductor processing device can include a supply channel that supplies gas to the axial portion of the bore at a first location along the longitudinal axis. The lateral portion can be disposed at a second location downstream of the first location, the lateral portion extending non-parallel relative to the longitudinal axis. The semiconductor processing device can include a reaction chamber disposed downstream of and in fluid communication with the bore.

In another embodiment, a method of deposition is disclosed. The method can include providing a manifold comprising a bore therein. The bore can define a gas passageway between a first end portion of the manifold and a second end portion of the manifold. The first end portion can be disposed opposite to and spaced from the second end portion along a longitudinal axis of the manifold by a first distance. The method can comprise supplying a reactant gas to the bore. The method can comprise directing the reactant gas along the gas passageway from the first end portion to the second end portion for a second distance, the second distance larger than the first distance.

In another embodiment, a method of deposition is disclosed. The method can include providing a manifold comprising a bore having an axial portion that defines a longitudinal axis of the manifold and a lateral portion extending non-parallel to the longitudinal axis. The method can include supplying a reactant gas to the axial portion of the bore at a first location along the longitudinal axis. The method can include directing the reactant gas through the axial portion of the bore parallel to the longitudinal axis. Downstream of the axial portion, the reactant gas can be directed through the lateral portion of the bore in a direction non-parallel to the longitudinal axis.

In another embodiment, a semiconductor processing device is disclosed. The semiconductor processing device can include a manifold comprising a bore defining an inner wall a channel through the manifold and a source of gas. A supply channel can deliver the gas to the bore by way of an opening on the inner wall of the bore. All the gas can be delivered to the bore by the opening.

In another embodiment, a method of deposition is disclosed. The method can include providing a manifold comprising a bore having an inner wall and defining a channel through the manifold. The method can include supplying all of a reactant gas through a single opening on the inner wall of the bore.

BRIEF DESCRIPTION OF THE DRAWINGS

These and other features, aspects and advantages of the present invention will now be described with reference to the drawings of several embodiments, which embodiments are intended to illustrate and not to limit the invention.

FIGS. 6A-6J illustrate an embodiment of a semiconductor processing device in which the manifold has an extended mixing length.

DETAILED DESCRIPTION

Figure 1A:
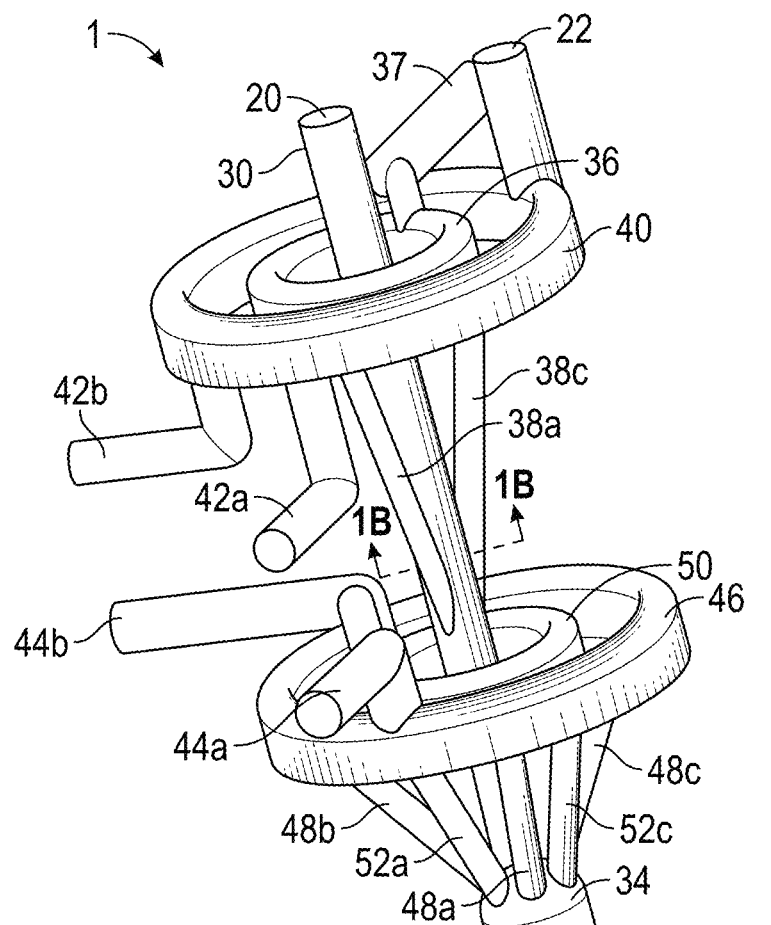
FIG. 1A is a schematic illustration of a flow path through a manifold of a semiconductor processing device.

In vapor or gas deposition processes, it can be important to provide uniform deposition across the width or major surface of the substrate (e.g., a semiconductor wafer). Uniform deposition ensures that deposited layers have the same thickness and/or chemical composition across the substrate, which improves the yield of integrated devices (e.g., processors, memory devices, etc.), and therefore the profitability per substrate. To improve the uniformity of deposition, various embodiments disclosed herein can enhance the mixing profile of the different gases supplied within a manifold of the semiconductor processing system. Enhanced mixing of supplied gases can beneficially supply a relatively uniform gas mixture across the major surface of the substrate.

I. Overview of Atomic Layer Deposition Processes

The embodiments disclosed herein can be utilized with semiconductor processing devices configured for any suitable gas or vapor deposition process. For example, the illustrated embodiments show various systems for depositing material on a substrate using atomic layer deposition (ALD) techniques. Among vapor deposition techniques, ALD has many advantages, including high conformality at low temperatures and fine control of composition during the process. ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses. Removal can be accomplished by a variety of techniques, including purging and/or lowering pressure between pulses. Pulses can be sequential in a continuous flow, or the reactor can be isolated and can backfilled for each pulse.

Briefly, a substrate is loaded into a reaction chamber and is heated to a suitable deposition temperature, generally at lowered pressure. Deposition temperatures are typically maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved.

A first reactant is conducted into the chamber in the form of vapor phase pulse and contacted with the surface of a substrate. Conditions are preferably selected such that no more than about one monolayer of the precursor is adsorbed on the substrate surface in a self-limiting manner. Excess first reactant and reaction byproducts, if any, are purged from the reaction chamber, often with a pulse of inert gas such as nitrogen or argon.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times for a single wafer reactor are from about 0.05 to 20 seconds, more preferably between about 1 and 10 seconds, and still more preferably between about 1 and 2 seconds. However, other purge times can be utilized if desired, such as when depositing layers over extremely high aspect ratio structures or other structures with complex surface morphology is needed, or when a high volume batch reactor is employed. The appropriate pulsing times can be readily determined by the skilled artisan based on the particular circumstances.

A second gaseous reactant is pulsed into the chamber where it reacts with the first reactant bound to the surface. Excess second reactant and gaseous by-products of the surface reaction are purged out of the reaction chamber, preferably with the aid of an inert gas. The steps of pulsing and purging are repeated until a thin film of the desired thickness has been formed on the substrate, with each cycle leaving no more than a molecular monolayer. Some ALD processes can have more complex sequences with three or more precursor pulses alternated, where each precursor contributes elements to the growing film. Reactants can also be supplied in their own pulses or with precursor pulses to strip or getter adhered ligands and/or free by-product, rather than contribute elements to the film. Additionally, not all cycles need to be identical. For example, a binary film can be doped with a third element by infrequent addition of a third reactant pulse, e.g., every fifth cycle, in order to control stoichiometry of the film, and the frequency can change during the deposition in order to grade film composition. Moreover, while described as starting with an adsorbing reactant, some recipes may start with the other reactant or with a separate surface treatment, for example to ensure maximal reaction sites to initiate the ALD reactions (e.g., for certain recipes, a water pulse can provide hydroxyl groups on the substrate to enhance reactivity for certain ALD precursors).

As mentioned above, each pulse or phase of each cycle is preferably self-limiting. An excess of reactant precursors is supplied in each phase to saturate the susceptible structure surfaces. Surface saturation ensures reactant occupation of all available reactive sites (subject, for example, to physical size or steric hindrance restraints) and thus ensures excellent step coverage over any topography on the substrate. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide near perfect self-limiting behavior and thus maximum conformality, but steric hindrance results in less than one molecular layer per cycle. Limited CVD reactions mixed with the self-limiting ALD reactions can raise the deposition speed. While embodiments described herein are particularly advantageous for sequentially pulsed deposition techniques, like ALD and mixed-mode ALD/CVD, the manifold can also be employed for pulsed or continuous CVD processing.

Examples of suitable reactors that may be used include commercially available ALD equipment such as any of the EmerALD® or Eagle® series reactors, available from ASM International of Almere, the Netherlands. Many other kinds of reactors capable of ALD growth of thin films, including CVD reactors equipped with appropriate equipment and means for pulsing the precursors, can be employed. In some embodiments a flow type ALD reactor is used, as compared to a backfilled reactor. In some embodiments, the manifold is upstream of an injector designed to distribute gas into the reaction space, particularly a dispersion mechanism such as a showerhead assembly above a single-wafer reaction space.

The ALD processes can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated to the process temperature before each run. A stand-alone reactor can be equipped with a load-lock. In that case, it is not necessary to cool down the reaction space between each run. These processes can also be carried out in a reactor designed to process multiple substrates simultaneously, e.g., a mini-batch type showerhead reactor.

FIG. 1A is a schematic illustration of a flow path 1 through a manifold of a semiconductor processing device. FIG. 1A illustrates the configuration of various channels inside the manifold, without showing the structure of the manifold itself, so as to better illustrate the relative orientation and interconnection of the internal channels of a manifold. The illustrated flow path 1 includes a bore 30 with an inert gas inlet 20 and an outlet 32. The cross-sectional area of the bore 30 increases between the inlet 20 and the outlet 32. In the illustrated arrangement, the cross-sectional area increases at a tapered portion 34, which in the illustrated arrangement coincides with a merger of some of the reactant flow paths. The flow path 1 also includes a second inert gas inlet 22 which is in fluid communication with an inert gas distribution channel 40. The inert gas distribution channel 40 extends generally in a plane intersecting the longitudinal axis of the bore 30. Although the illustrated inert gas distribution channel 40 follows a circular curvature and extends a full 360°, in some embodiments, inert or reactant gas distribution channels can have other shapes (e.g., elliptical), and need not be a closed shape, that is, can extend only partway about the longitudinal axis of the bore, such as a C-shaped channel.

The inert gas distribution channel 40 feeds inert gas to two inert gas passageways 42a, 42b, each of which can be connected to an inert gas valve. The inert gas passageways 42a, 42b connect with the inert gas distribution channel 40 at different angular locations distributed about the axis of the bore 30 (as viewed in a transverse cross-section). In the illustrated arrangement, the inert gas passageways 42a, 42b connect with the inert gas distribution channel 40 about 90° apart from one another, and about 135° (in opposite directions) from where the inert gas inlet 22 connects with the inert gas distribution channel 40.

The flow path 1 also includes a reactant gas passageway 37 which is in fluid communication with a reactant gas distribution channel 36. The reactant gas distribution channel 36 extends generally in a plane intersecting the longitudinal axis of bore 30, and is generally concentric with the inert gas distribution channel 40. The reactant gas distribution channel 36 conveys gas to multiple, e.g., three reactant gas supply channels 38a, 38b, 38c (only two of which are visible in FIG. 1A), each of which connects with the reactant gas distribution channel 36 at a different angular location about the axis of the bore 30 (as viewed in a transverse cross-section). In the illustrated embodiment, each of the reactant gas supply channels 38a, 38b, 38c connect with the reactant gas distribution channel 36 at a location which is angularly offset from where the reactant gas passageway 37 connects with the reactant gas distribution channel 36. The reactant gas supply channels 38a, 38b, 38c also connect with the bore 30 at different angular locations distributed about the axis of the bore (as viewed in a transverse cross-section), and at an angle with respect to the longitudinal axis of the bore 30 (as viewed in a longitudinal cross-section).

The flow path 1 also includes another reactant gas passageway 44b which is in fluid communication with a reactant gas distribution channel 50. The reactant gas distribution channel 50 extends generally in a plane intersecting the longitudinal axis of bore 30. The reactant gas distribution channel 50 conveys reactant gas to multiple, e.g., three reactant gas supply channels 52a, 52b, 52c (only two of which are visible in FIG. 1A), each of which connects with the reactant gas distribution channel 50 at a different angular location about the axis of the bore 30 (as viewed in a transverse cross-section). The reactant gas supply channels 52a, 52b, 52c also connect with the bore 30 at different angular locations about the axis of the bore (as viewed in a transverse cross-section), and at an angle with respect to the longitudinal axis of the bore (as viewed in a longitudinal cross-section).

The flow path 1 also includes a further reactant gas inlet 44a which is in fluid communication with a reactant gas distribution channel 46. The reactant gas distribution channel 46 extends generally in a plane intersecting the longitudinal axis of bore 30. The reactant gas distribution channel 46 conveys reactant gas to multiple, e.g., three reactant gas supply channels 48a, 48b, 48c, each of which connects with the reactant gas distribution channel 46 at a different angular location about the axis of the bore 30 (as viewed in a transverse cross-section. The reactant gas supply channels 48a, 48b, 48c also connect with the bore 30 at different angular locations about the axis of the bore 30 (as viewed in a transverse cross-section), and at an angle with respect to the longitudinal axis of the bore 30 (as viewed in a longitudinal cross-section). Each of the reactant gas supply channels 48a, 48b, 48c connects with the bore 30 at a location which is angularly offset from where the reactant gas supply channels 52a, 52b, 52c connect with the bore. The reactant gas supply channels 48a, 48b, 48c also connect with the bore 30 at a greater angle than the reactant gas supply channels 52a, 52b, 52c due to the reactant gas distribution channel 46 being a greater distance from the bore 30 than the reactant gas distribution channel 50. Additionally, the bore 30 widens at the tapered portion 34 where the reactant gas supply channels 52a, 52b, 52c, 48a, 48b, 48c merge with the bore 30. This allows a smoother merger and mixing of the reactants entering at this point with flow of gas (e.g., inert gas) that enters at upstream portions of the bore 30.

Figure 1B:
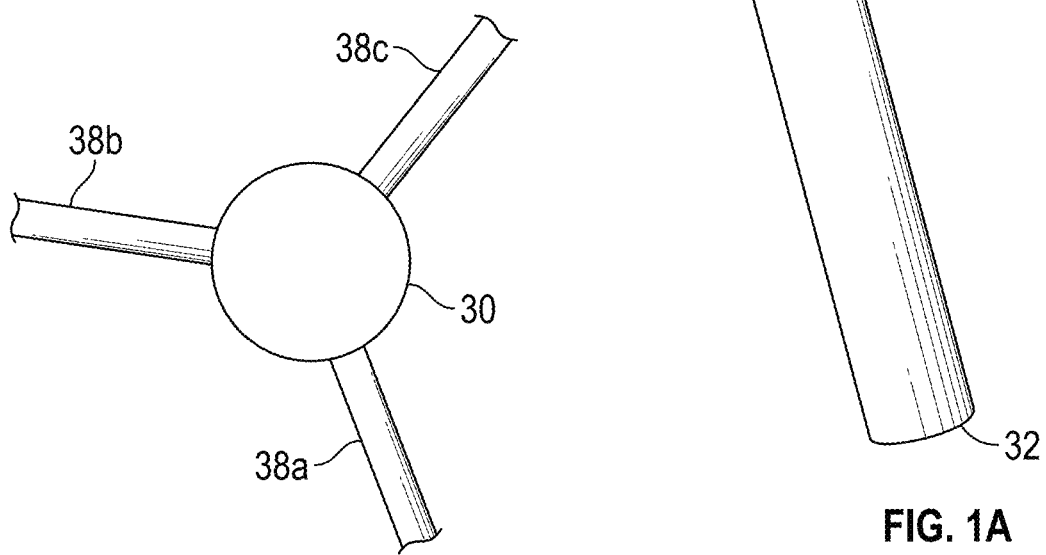
FIG. 1B is a schematic partial transverse cross-section of the flow path shown in FIG. 1A, taken along lines 1B-1B.

FIG. 1B is a schematic partial transverse cross-section of the flow path shown in FIG. 1A, taken along lines 1B-1B. As shown in FIG. 1B, the reactant gas supply channels 38a, 38b, 38c connect with the bore 30 at different angular locations about the axis of the bore. As also shown in FIG. 1B, horizontal components of the reactant gas supply channels 38a, 38b, 38c extend in a radial direction from the axis (or, from the center) of the bore. The horizontal components of the reactant gas supply channels 52a, 52b, 52c and the reactant gas supply channels 48a, 48b, 48c can also connect with the bore in a radial fashion. Here, "horizontal" is meant to convey components of the supply channels in the plane of the cross-section, transverse to the bore axis, rather than any particular orientation relative to ground.

Thus, in the flow pathway 1 shown in FIGS. 1A-1B, a reactant gas pulse can deliver reactant gas through three separate supply channels and openings to the bore 30. For example, in one pulse, a first reactant gas can be supplied to the bore 30 by way of the supply channels 38a, 38b, 38c. In another pulse, a second reactant gas can be supplied to the bore 30 by way of the supply channels 52a, 52b, 52c. In a third pulse, a third reactant gas can be supplied to the bore 30 by way of the supply channels 48a, 48b, 48c. Additional details of the flow path 40, and the semiconductor processing devices that define the flow path 40, can be found throughout U.S. patent application Ser. No. 13/284,738, filed Oct. 28, 2011, the contents of which are incorporated by reference herein in their entirety and for all purposes.

Figure 1C:
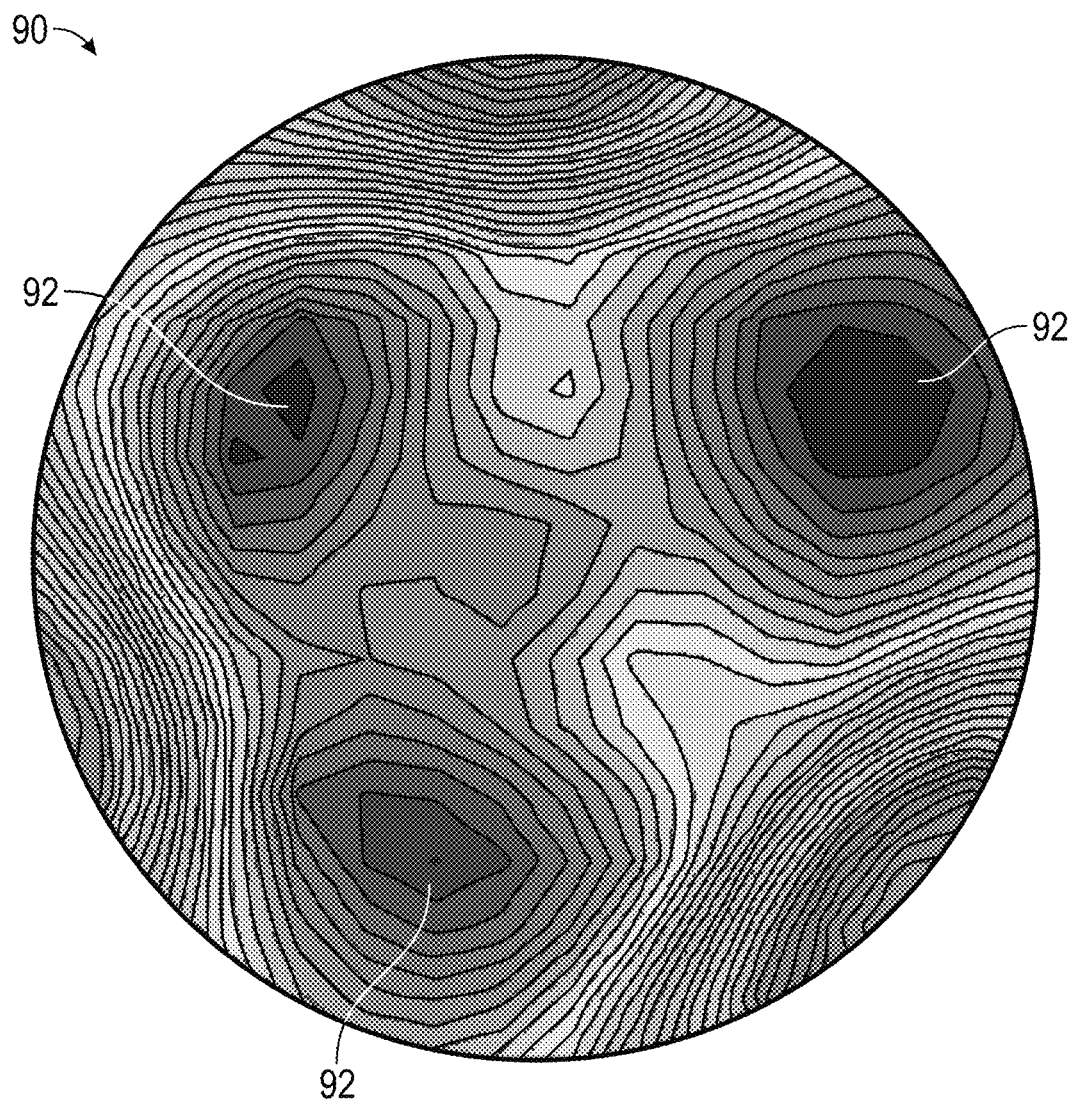
FIG. 1C is a schematic top view of a gas deposition pattern on a substrate that is processed according to the flow path of FIGS. 1A-1B.

FIG. 1C is a schematic top view of a gas deposition pattern 90 on a substrate that is processed according to the flow path 1 of FIGS. 1A-1B. As shown in FIG. 1C, the deposition pattern 90 includes three distinct spots 92 of regions with high concentrations of reactant gas mixtures, with the surrounding regions at lower concentrations. The three distinct spots 92 may result from the use of three distinct openings to the bore 30 that are in communication with three separate supply channels (such as supply channels 52a-52c, 48a-48c, 38a-38c) that convey the same reactant gas to the bore 30 and ultimately to the substrate. Such non-uniform deposition may be undesirable, because different regions of the substrate may have different deposition chemistries and/or thicknesses, which can ultimately reduce device yield. Accordingly, there remains a continuing need for improving the uniformity of vapor deposition in semiconductor processing devices.

II. Manifolds with Annular Supply Slit and/or Annular Flow Pathways

In some embodiments, vapor deposition uniformity can be improved by providing an at least partially annular slit in an inner wall of the bore to supply gases to the bore. For example, in various embodiments, the bore can comprise a first axial portion extending along a longitudinal axis of the manifold. A supply channel can be in fluid communication between a gas source (e.g., a reactant gas source) and the bore. The supply channel can comprise a slit defining an at least partially annular gap through the inner wall of the bore to deliver a gas from the gas source to the bore. The at least partially annular gap can be revolved about the longitudinal axis of the manifold.

In addition, or alternatively, an at least partially annular flow pathway can be created in the bore to deliver gases along a longitudinal axis of the manifold. For example, a supply channel can be in fluid communication between a gas source (e.g., a reactant gas source) and the bore. The bore can comprise a channel having an annular flow portion with an at least partially annular cross-section and a non-annular flow portion with a non-annular cross-section. The non-annular cross-section can be disposed downstream of the annular flow portion.

Figure 2:
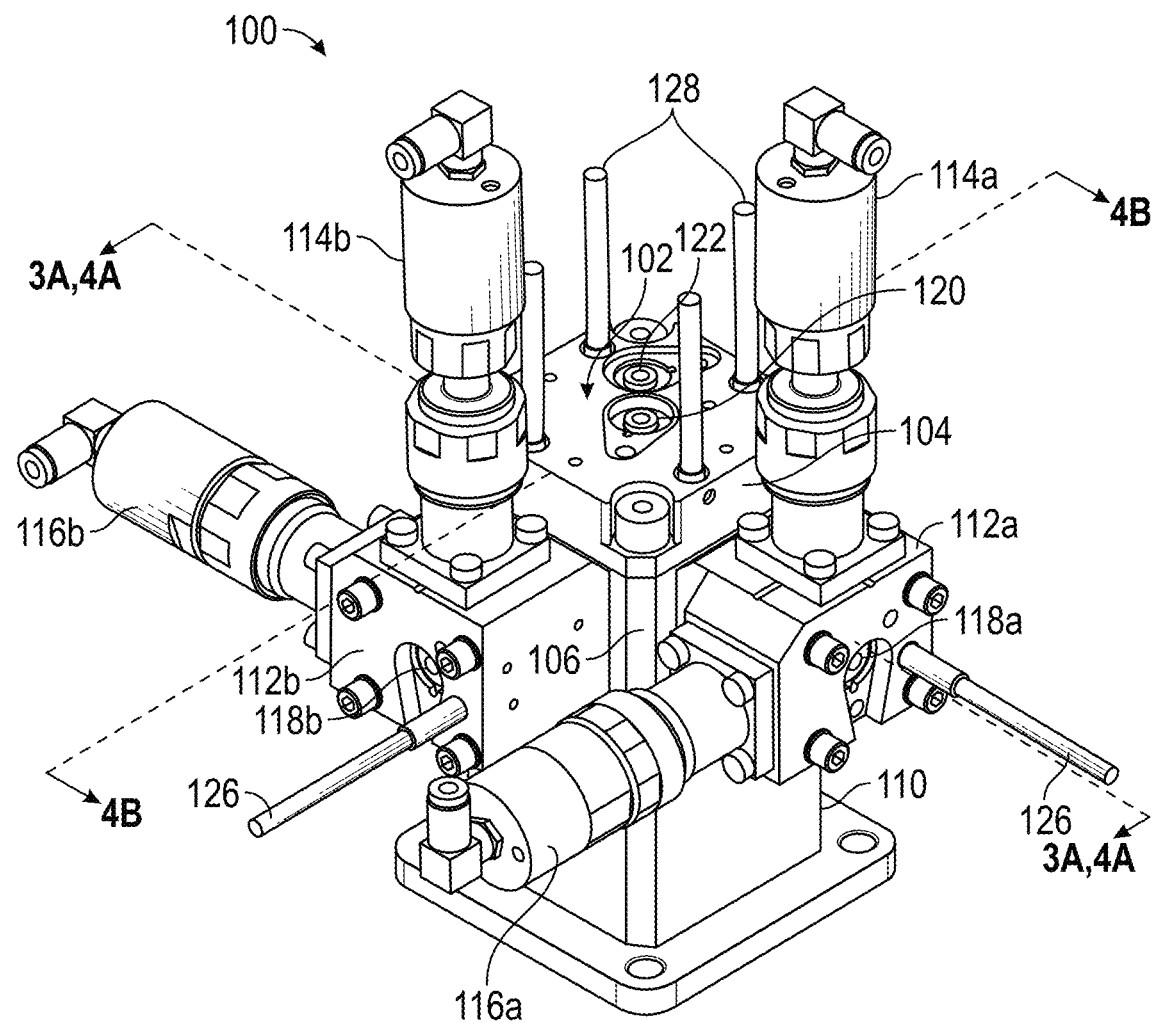
FIG. 2 is a perspective view of an ALD manifold configured in accordance with various embodiments.

FIG. 2 is a perspective view of an ALD manifold 100 configured in accordance with various embodiments. Unless otherwise noted, the components of FIG. 2 may be generally similar to the components of FIG. 1, except like components have been incremented by 100 relative to FIG. 1. As shown in FIG. 2, the manifold 100 comprises a body 102 that includes four blocks: an upper block 104, an intermediate block 106, a lower block 108 (see FIG. 3A), and a diffuser block 110. Although FIG. 2 shows a composite manifold body 102 comprising multiple stacked sub-portions or blocks, some embodiments can comprise fewer or more sub-portions or blocks, while others can comprise a monolithic or unitary manifold body. The use of multiple blocks 104, 106, 108, 110 can beneficially enable the construction of channels disposed at various angles inside the manifold 100.

Mounted on the body 102 are two valve blocks 112a, 112b. An inert gas valve 114a and a reactant gas valve 116a are mounted on the valve block 112a. An inert gas valve 114b and a reactant gas valve 116b are mounted on the valve block 112b. Each of the valve blocks 112a, 112b can include a reactant gas inlet 118a, 118b. At upper block 104, the manifold body 102 includes two inert gas inlets 120, 122. The reactant gas inlets 118a, 118b can be connected to different reactant sources, some of which may be naturally gaseous (i.e., gaseous at room temperature and atmospheric pressure), and some of which may be solid or liquid under standard conditions.

The body 102 can also include one or more heaters 128. Each of the valve blocks 112a, 112b can also include one or more heaters 126. The heaters 126, 128 can be disposed in such a manner as to maintain as constant a temperature as possible throughout the body 102 and/or the valve blocks. The heaters 126, 128 can be any type of heater that can operate at high temperatures suitable for ALD processes, including without limitation linear rod-style, heater jacket, heater blank, heat trace tape, or coiled resistance heaters.

Figure 3A:
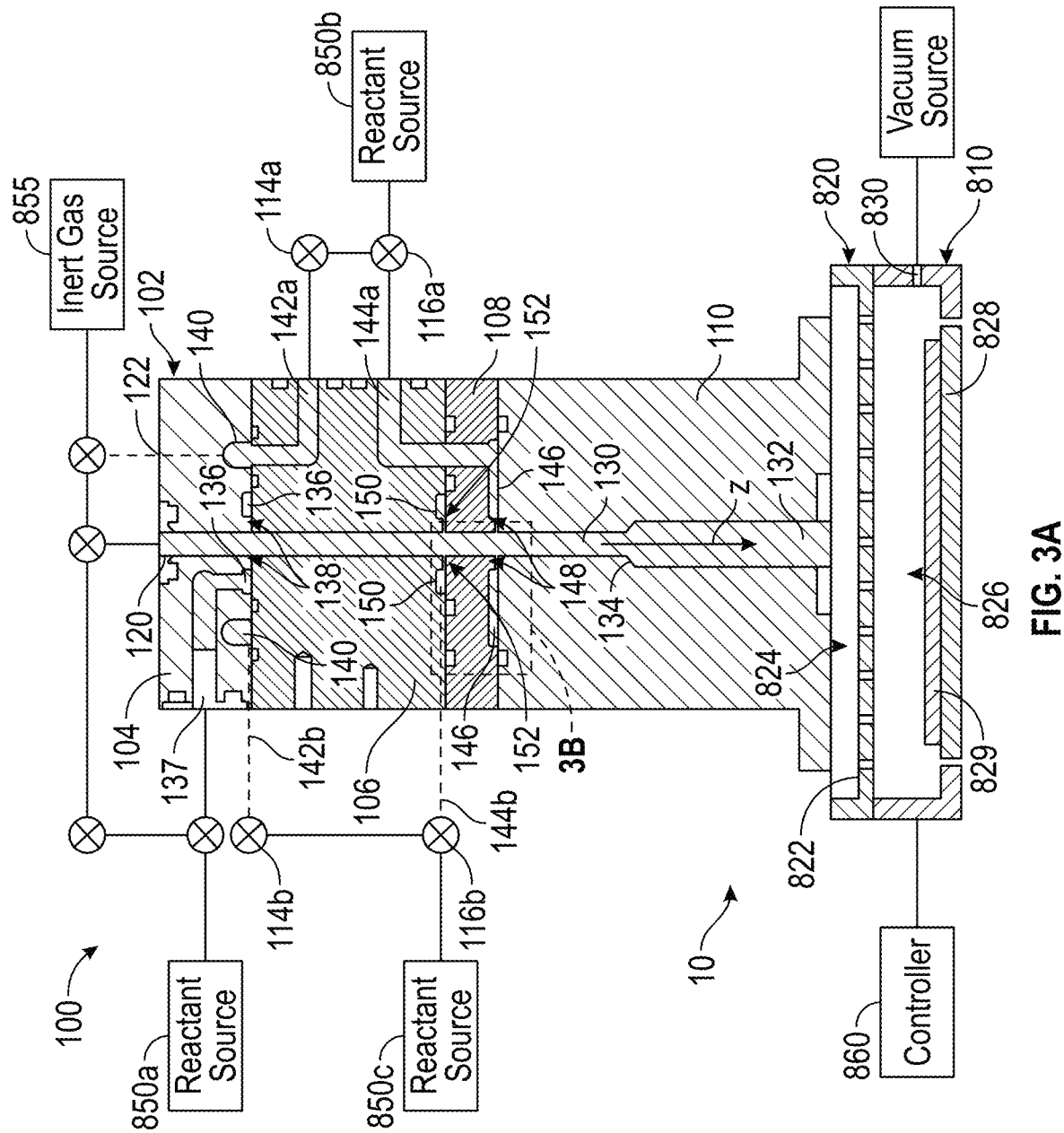
FIGS. 3A-3D illustrate an embodiment of a semiconductor device, in which a supply channel comprising a slit is used to supply gas to the bore.

FIG. 3A is a schematic side cross-sectional view of a semiconductor processing device 10 including the manifold 100 of FIG. 2, taken along lines 3A-3A of FIG. 2. As shown in FIG. 3A, the semiconductor processing device 10 can include the manifold 100 and a reaction chamber 810 disposed downstream of and coupled with the manifold body 102. The manifold body 102 can comprise a longitudinal axis Z along which the bore 130 extends (or along which an axial portion of the bore 130 extends). In FIG. 3A, the inert gas inlet 120 at the top of the manifold body 102 connects with the bore 130 that extends longitudinally through the body 102 to an outlet 132. The bore 130 has a larger cross-sectional area near the outlet 132 than it does near the inlet 120. In the illustrated embodiment, the increase in cross-sectional area occurs at a tapered portion 134 of the bore 130. Although not illustrated, an expander or other segment may be connected to the bottom of the manifold 100 to widen the flow path between the outlet 132 of the bore 130 and the reaction chamber 810.

Figure 3B:
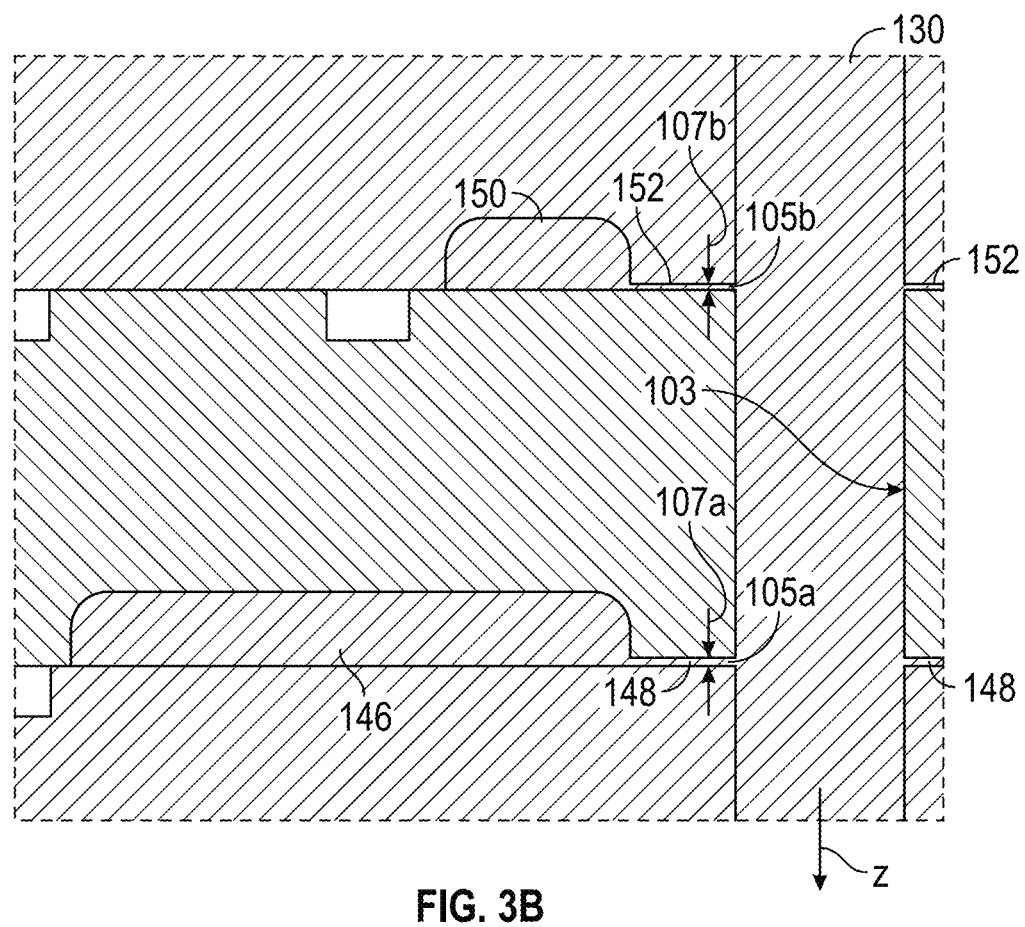

A first reactant gas source 850a can connect with a distribution channel 136 in the body 102 via a passageway 137. The distribution channel 136 can be formed by lower and upper surfaces, respectively, of the upper block 104 and the intermediate block 106, and can extend in a plane that intersects with the longitudinal axis of the bore 130. For example, in some embodiments, the distribution channel 136 can be revolved at least partially (e.g., entirely) about the longitudinal axis Z of the manifold 100. The distribution channel 136 can be in fluid communication with the bore 130 via a supply channel 138 comprising a slit through an inner wall 103 defined by the bore 130. FIG. 3B illustrates examples of the slit formed through the inner wall 103.

The inert gas inlet 122 (see also FIG. 2) connects with an inert gas distribution channel 140 in the body 102. The dashed line shown at the inlet 122 in FIG. 3A indicates that the passageway which connects the inlet 122 to the inert gas distribution channel 140 is not disposed in the cross-section defined in FIG. 3A. An inert gas source 855 can supply an inert gas to the inert gas inlet 122 and the inert gas distribution channel 140. The inert gas distribution channel 140 shown in FIG. 3A is formed by lower and upper surfaces, respectively, of the upper block 104 and the intermediate block 106, and extends in a plane that intersects the longitudinal axis of the bore 130. In some embodiments, the inert gas channel 140 can be disposed at about the same longitudinal location as the distribution channel 136. The inert gas distribution channel 140 can supply inert gas to the inert gas valve 114a via a passageway 142a. The inert gas channel 140 may be revolved around the longitudinal axis Z, and may be disposed concentric relative to (e.g., concentrically about) the distribution channel 136. As shown in FIGS. 2 and 3A, the passageway 142a extends through the intermediate block 106 and the valve block 112a. The inert gas distribution channel 140 can also supply inert gas to the inert gas valve 114b via a passageway 142b. The dashed lines for the passageway 142b indicate that the passageway 142b does not lie in the illustrated cross-section.

With continued reference to FIG. 3A, the inert gas valve 114a controls a supply of inert gas from the passageway 142a (and thus, from the inert gas distribution channel 140) to the reactant gas valve 116a. The reactant gas valve 116a controls a supply of a reactant gas from the inlet 118a (or a mixture of a reactant gas from the inlet 118a and an inert gas from the inert gas valve 114a) to a passageway 144a, which is connected to a gas distribution channel 146 in the body 102. A second reactant source 850b can supply a reactant gas to the inlet 118a, the reactant gas valve 116a, and the passageway 144a. As shown in FIGS. 2 and 3A, the passageway 144a extends through the valve block 112a, the intermediate block 106, and the lower block 108. The distribution channel 146 can be formed by lower and upper surfaces, respectively, of the lower block 108 and the diffusion block 110, and can extend in a plane that intersects the longitudinal axis Z of the manifold 100 (e.g., normal to the longitudinal axis Z in some embodiments). The distribution channel 146 can be in fluid communication with the bore 130 via a supply channel 148 comprising a slit (see FIG. 3B) through an inner wall 103 defined by the bore 130.

As shown in FIG. 3A, the inert gas valve 114b can control a supply of inert gas from the passageway 142b (and thus, from the inert gas distribution channel 140) to the reactant gas valve 116b (see FIG. 2). The reactant gas valve 116b controls a supply of a reactant gas from the inlet 118b (or a mixture of a reactant gas from the inlet 118b and an inert gas from the inert gas valve 114b) to a passageway 144b, which is connected to a distribution channel 150 in the body 102. The dashed lines in FIG. 3A indicate that the passageways 142b, 144b do not lie in the cross-section illustrated in FIG. 3A. A third reactant source 850c can supply a reactant gas to the inlet 118b, the reactant gas valve 116b, and the passageway 144b. As shown in FIG. 3A, the passageway 144b extends through the valve block 112b and the intermediate block 106. The distribution channel 150 and/or the passageway 144b can be formed by lower and upper surfaces, respectively, of the intermediate block 106 and the lower block 108, and can extend in a plane that intersects the longitudinal axis Z of the manifold 100 (e.g., normal to the longitudinal axis Z in some embodiments). The distribution channel 150 can be in fluid communication with the bore 130 via a supply channel 152 comprising a slit (see FIG. 3B) through an inner wall 103 defined by the bore 130. As shown in FIG. 3A, the distribution channel 150 and the supply channel 152 can be disposed and can connect with the bore 130 at a location along the longitudinal axis Z that is upstream of the distribution channel 146 and the supply channel 148.

While illustrated with three reactant inlets and two inert gas inlets to the manifold body 102, the number of precursor/reactant and inert gas inlets can vary in embodiments. Also, while illustrated with two each, the number of precursor/reactant valves 116a, 116b and inert gas valves 114a, 114a feeding distribution channels can vary in embodiments, depending on the particular application and the desired processing capability of the ALD system. An ALD system may include at least two reactants and gas distribution channels therefor. The valves 114a, 114b, 116a, and 116b may be any type of valve that can withstand high temperatures within the ALD hot zone. Valves 114a, 114b, 116a, and 116b may be ball valves, butterfly valves, check valves, gate valves, globe valves or the like. Metal diaphragm valves may also be used, and may be preferred for a high temperature environment (e.g., in temperatures up to about 220° C.). In some embodiments, the valves 114a, 114b, 116a, and 116b can be, for example and without limitation, pneumatically actuated valves or piezoelectric solenoid type valves. In embodiments, the valves 114a, 114b, 116a, and 116b can be configured to operate at very high speeds, for example, with opening and closing times of less than 80 ms, with speeds of less than 10 ms in some embodiments. The valves 114a, 114b, 116a, and 116b may be formed from any material that will function at the high temperatures required for ALD processing, such as 316L stainless steel and the like. Some embodiments, such as an ALD system configured for alumina deposition, can include valves configured to operate up to 220° C. Still other embodiments can include valves configured to operate at temperatures up to 300° C., up to 400° C., or at even higher temperatures.

The manifold body 102 of FIG. 3A can be connected upstream of the reaction chamber 810. In particular, the outlet 132 of the bore 130 can communicate with a reactant injector, particularly a dispersion mechanism in the form of a showerhead 820 in the illustrated embodiment. The showerhead 820 includes a showerhead plate 822 that defines a showerhead plenum 824 or chamber above the plate 822. The showerhead 820 communicates vapors from the manifold 100 to a reaction space 826 below the showerhead 820. The reaction chamber 810 includes a substrate support 828 configured to support a substrate 829 (e.g., a semiconductor wafer) in the reaction space 826. The reaction chamber also includes an exhaust opening 830 connected a vacuum source. While shown with a single-wafer, showerhead type of reaction chamber, the skilled artisan will appreciate that manifold can also be connected to other types of reaction chambers with other types of injectors, e.g. batch or furnace type, horizontal or cross-flow reactor, etc.

In the illustrated embodiment, three reactant sources 850a-850c are shown, although fewer or greater numbers can be provided in other arrangements. In some embodiments, one or more of the reactant sources 850a-850c can contain a naturally gaseous ALD reactant, such as $H_2$, $NH_3$, $N_2$, $O_2$, or $O_3$. Additionally or alternatively, one or more of the reactant sources 850a-850c can include a vaporizer for vaporizing a reactant which is solid or liquid at room temperature and atmospheric pressure. The vaporizer(s) can be, e.g., liquid bubblers or solid sublimation vessels. Examples of solid or liquid reactants that can be held and vaporized in a vaporizer include, without limitation, liquid organometallic precursors such as trimethylaluminum (TMA), TEMAHf, or TEMAZr; liquid semiconductor precursors, such as dichlorosilane (DCS), trichlorosilane (TCS), trisilane, organic silanes, or TiCl4; and powdered precursors, such as $ZrCl_4$ or $HfCl_4$. The skilled artisan will appreciate that embodiments can include any desired combination and arrangement of naturally gaseous, solid or liquid reactant sources.

As shown in FIG. 3A, the inert gas source 855 can provide purge gas to the reactant valves 116a, 116b and thus to the reactant distribution channels 146, 150 (via the inert gas inlet 122, distribution channel 140, passageways 142a, 142b and inert gas valves 114a, 114b). The inert gas source 855 is shown feeding the top of the central bore 130 (via the inert gas inlet 120). The same inert gas source 855 may also purge the reactant distribution channel 136 (via the reactant inlet 124 and the passageway 137). However, in other embodiments, separate inert gas sources can be provided for each of these feeds.

The semiconductor processing device 10 can also include at least one controller 860, including processor(s) and memory with programming for controlling various components of the device 10. While shown schematically as connected to the reaction chamber 810, the skilled artisan will appreciate that the controller 860 communicates with various components of the reactor, such as vapor control valves, heating systems, gate valves, robot wafer carriers, etc., to carry out deposition processes. In operation, the controller 860 can arrange for a substrate 829 (such as a semiconductor wafer) to be loaded onto the substrate support 828, and for the reaction chamber 810 to be closed, purged and typically pumped down in readiness for deposition processes, particularly atomic layer deposition (ALD). A typical ALD sequence will now be described with reference to the reactor components of FIGS. 2 and 3A.

In one embodiment, prior to reactant supply and during the entire ALD process, purge gas flows through the top inlet 120 into the bore 130. When the controller instructs a first ALD reactant pulse, for example from the reactant source 850b, the reactant valve 116a is open to permit flow from the reactant source 850a into the passageway 144a and around the distribution channel 146. Backpressure within the distribution channel 146 enables distribution of the gas through the supply channel 148 leading from the distribution channel 146 to the bore 130, where the first reactant merges with the inert gas flow from the inlet 120. At the same time, inert gas can flow through all other reactant channels (e.g., the reactant distribution channel 136, the supply channel 138, the reactant distribution channel 150 and supply channel 152) into the bore 130. From the bore 130, the mixture of inert gas and first reactant is fed to the showerhead plenum 824 and distributed across the showerhead plate 822 (or other dispersion mechanism) and into the reaction space 826. During this first reactant pulse, the narrower portion of the bore 130 upstream of the tapered portion 134 is filled with flowing inert gas and prevents upstream diffusion of the reactant.

After a sufficient duration to saturate the substrate 829 surface with the first reactant, the controller 860 switches off the reactant valve 116a, opens the inert gas valve 114a, and thus purges the reactant valve 116a, the passageway 144a, the reactant distribution channel 146 and the depending supply channel 148. Inert gas can continue to be supplied through the bore 130 from the top inlet 120 and the other reactant pathways for a sufficient duration to purge the manifold 100, the showerhead plenum 824, and the reaction space 826 of any remaining first reactant and/or byproduct. The skilled artisan will appreciate that other reactant removal procedures can be used in place of or in addition to purging.

After a suitably long removal period to avoid interaction of the first reactant with the subsequent reactant, the controller 860 can instruct control valves to supply a second ALD reactant from, e.g., the gaseous reactant source 850a, into the reactant passageway 137 and the upper reactant distribution channel 136. Backpressure within the distribution channel 136 enables distribution of the gas through the supply channel 138 leading from the distribution channel 136 to the bore 130, where the second reactant merges with the inert gas flow. At the same time, inert gas can flow through all other reactant channels (e.g., the reactant distribution channel 146, the supply channel 148, the reactant distribution channel 150 and supply channel 152) into the bore 130. From the bore 130, the mixture of inert gas and second reactant is fed to the showerhead plenum 824 and distributed across the showerhead plate 822 (or other dispersion mechanism) and into the reaction space 826. During this second reactant pulse, the portion of the bore 130 upstream of its merger with the supply channel 138 is filled with flowing inert gas, which prevents upstream diffusion of the second reactant. Similarly, the flow of inert gas through all other reactant flow paths prevents backwards diffusion of the second reactant.

Following saturative surface reaction on the substrate, a removal step similar to the purge step described above can be performed, including purging of the distribution channel 136 and its depending supply channel 138. The above described cycle can be repeated with the reactant distribution channel 150 and supply channel 152 to supply a third reactant gas to the substrate 829. The cycle can be further repeated until a sufficiently thick layer is formed on the substrate 829.

Figure 3C:
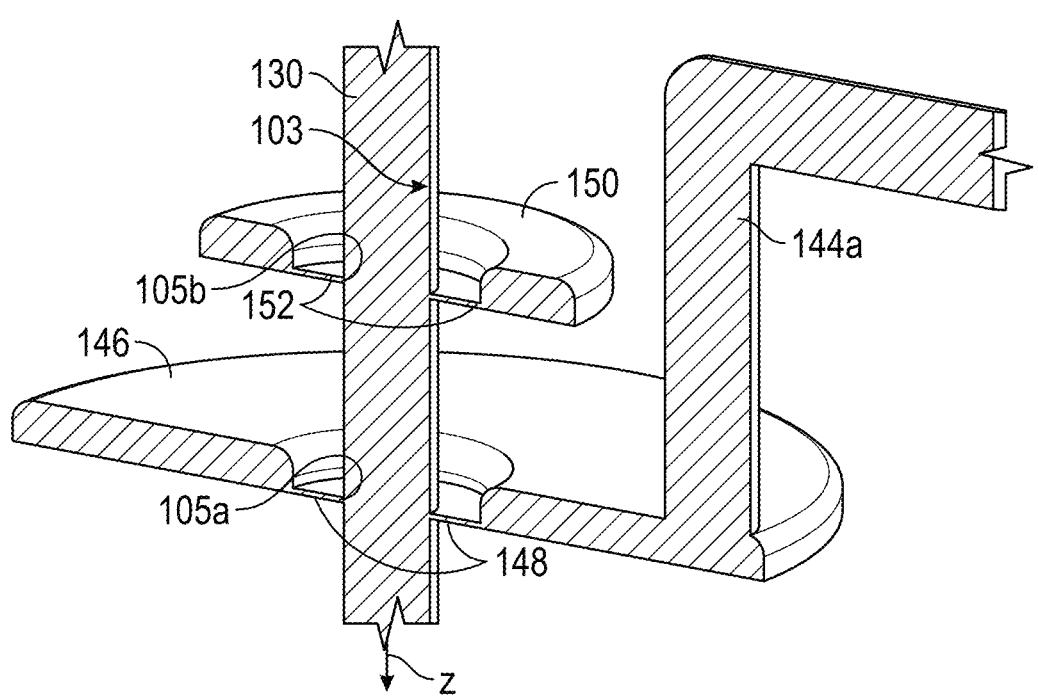

FIG. 3B is a magnified side cross-sectional view of the portion 3B of the semiconductor processing device 10 shown in FIG. 3A. In particular, FIG. 3B shows the reactant distribution channels 146, 150 which communicate with the bore 130 by way of the respective supply channels 148, 152. FIG. 3C is a schematic perspective cross-sectional view of a fluid pathway 101 defined through the distribution channels 146, 150 and supply channels 148, 152. In particular, FIG. 3C is a negative of the portion 3B of the semiconductor device 10, insofar as FIG. 3C illustrates the channels through which gas is supplied rather than the structure (e.g., the manifold 100) which defines the channels.

As shown in FIGS. 3B and 3C, the supply channels 148, 152 can each comprise a respective slit 105a, 105b that defines an at least partially annular gap 107a, 107b in the inner wall 103 of the bore 130. As shown in FIG. 3C, the slits 105a, 105b with associated gaps 107a, 107b can be revolved about the longitudinal axis Z of the manifold 100 such that the slits 105a, 105b define an at least partial annulus in the inner wall 103. In the embodiment illustrated in FIGS. 3A-3C, the slits 105a, 105b extend entirely around the longitudinal axis Z, i.e., the slits 105a, 105b define a complete annulus of 360° revolution about the longitudinal axis Z. In other embodiments, however, the slits 105a, 105b can define a partial annulus about the longitudinal axis Z. For example, the slits 105a, 105b can be revolved about the Z axis by an angle in a range of 90° to 360°, in a range of 120° to 360°, in a range of 180° to 360°, in a range of 240° to 360°, etc.

The gaps 107a, 107b defined by the slits 105a, 105b can comprise a narrow opening having a thickness less than a circumferential length of the slits 105a, 105b. That is, the arc length of the slits 105a, 105b along a perimeter or circumference of the inner wall 103 (i.e., about the axis Z) can be greater than the thickness of the gaps 107a, 107b. In some embodiments, the thickness of the gaps 107a, 107b can be in a range of 0.05 mm to 1.5 mm, or more particularly, in a range of 0.1 mm to 1 mm, in a range of 0.1 mm to 0.7 mm. In some embodiments, the thickness of the gaps 107a, 107b can be in a range of 0.05 mm to 0.5 mm, e.g., in a range of 0.1 mm to 0.5 mm, in a range of 0.1 mm to 0.3 mm, or in a range of 0.2 mm to 0.3 mm, or about 0.25 mm in some embodiments. In some embodiments, the thickness of the gaps 107a, 107b can be in a range of 0.3 mm to 1.5 mm, e.g., in a range of 0.3 mm to 1 mm, in a range of 0.3 mm to 0.7 mm, or in a range of 0.4 mm to 0.6 mm, or about 0.5 mm in some embodiments.

By contrast, the thickness of the distribution channels 146, 150 along the axis Z can be significantly greater than the thickness of the gaps 107a, 107b. For example, the thickness of the distribution channels 146, 150 can be at least twice as thick as the gaps 107a, 107b, at least five times as thick as the gaps 107a, 107b, at least ten times as thick as the gaps 107a, 107b, at least twenty times as thick as the gaps 107a, 107b, or at least fifty times as thick as the gaps 107a, 107b. The gases inside the distribution channels 146, 150 can have a backpressure caused by the restriction in thickness provided by the narrow gaps 107a, 107b. The backpressure can beneficially push the gases to the bore 130 through the gaps 107a, 107b of the slits 105a, 105b.

Figure 3D:
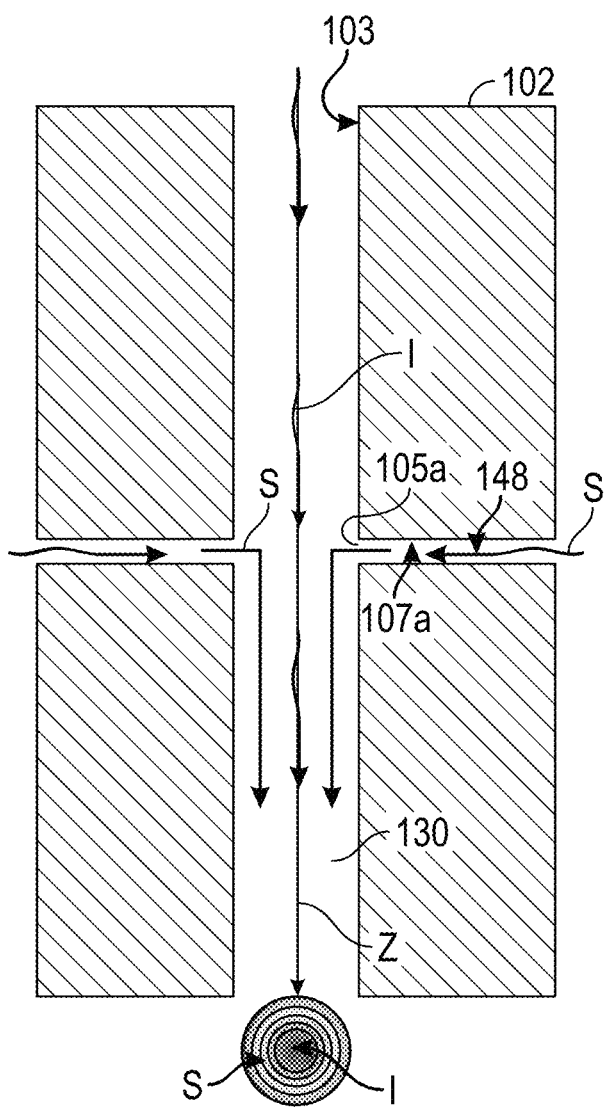

FIG. 3D is a schematic side cross-sectional profile of the manifold body 102 and bore 130 illustrating the flow of a source gas S and an inert gas I during an example processing pulse. As shown in FIG. 3D, inert gas I (such as argon, Ar) can be supplied to the bore 130 by way of the central inert gas inlet 120 at the top of the manifold 100. The inert gas I (e.g., Ar) can also be supplied to the bore 130 by the upstream supply channel 152, which may also comprise a slit as explained above. In the illustrated arrangement, the inert gas I supplied through the bore 130 upstream of the supply channel 148 can comprise a push gas that drives gas through the bore 130 at sufficient pressure to cause the gases to rapidly travel to the reaction chamber 810.

As shown in FIG. 3D, the source gas S (e.g., titanium chloride) can be supplied through the slit 105a of the supply channel 148 by way of the narrow gap 107a in the inner wall 103 of the manifold 102 and defined by the bore 130. The source gas S can be entrained with the inert gas I flowing downstream towards the reaction chamber 810. As shown in FIG. 3D, because the source gas S is introduced along the periphery of the bore 130 through the slit 105a, the source gas S may be concentrated about the outer edges of the central inert gas I flow path. Thus, as shown in FIG. 3D, the resulting downstream flow pattern can comprise a central inert gas I pattern disposed in the middle of the bore 130, and an annular source gas S pattern disposed about the inert gas I pattern. The flow pattern of inert I and source S gases may comprise a non-annular pattern defined by the cross-section of the bore 130. For example, the flow pattern of inert I and source S gases may mix together in a rounded (e.g., circular or elliptical) or polygonal cross-section defined by the cross-section of the bore 130.

The resulting patterns shown in FIG. 3D may be an improvement over the three-lobed flow pattern shown in FIG. 1C. Instead of three different lobes representing high source gas concentration, in FIG. 3D, the concentration of the source and inert gases varies continuously without the three hot spots shown in FIG. 1C. For example, in FIG. 3D, the flow pattern is somewhat non-uniform and varies from the center of the bore 130 to the wall 103 of the bore 130. However, adjustments to various processing temperatures may reduce the non-uniformity and enhance mixing.

Although the supply channels with slits described in connection with FIGS. 3A-3D may improve uniformity of gas mixing in the manifold 100, it may be desirable to further improve the mixing in order to improve device yield. FIGS. 4A-4F illustrate another embodiment of a semiconductor device 1, in which the bore comprises a channel with an annular flow portion and a non-annular flow portion. Unless otherwise noted, the components of FIGS. 4A-4F may be similar to or the same as like numbered components in FIGS. 2-3D.

Figure 4A:
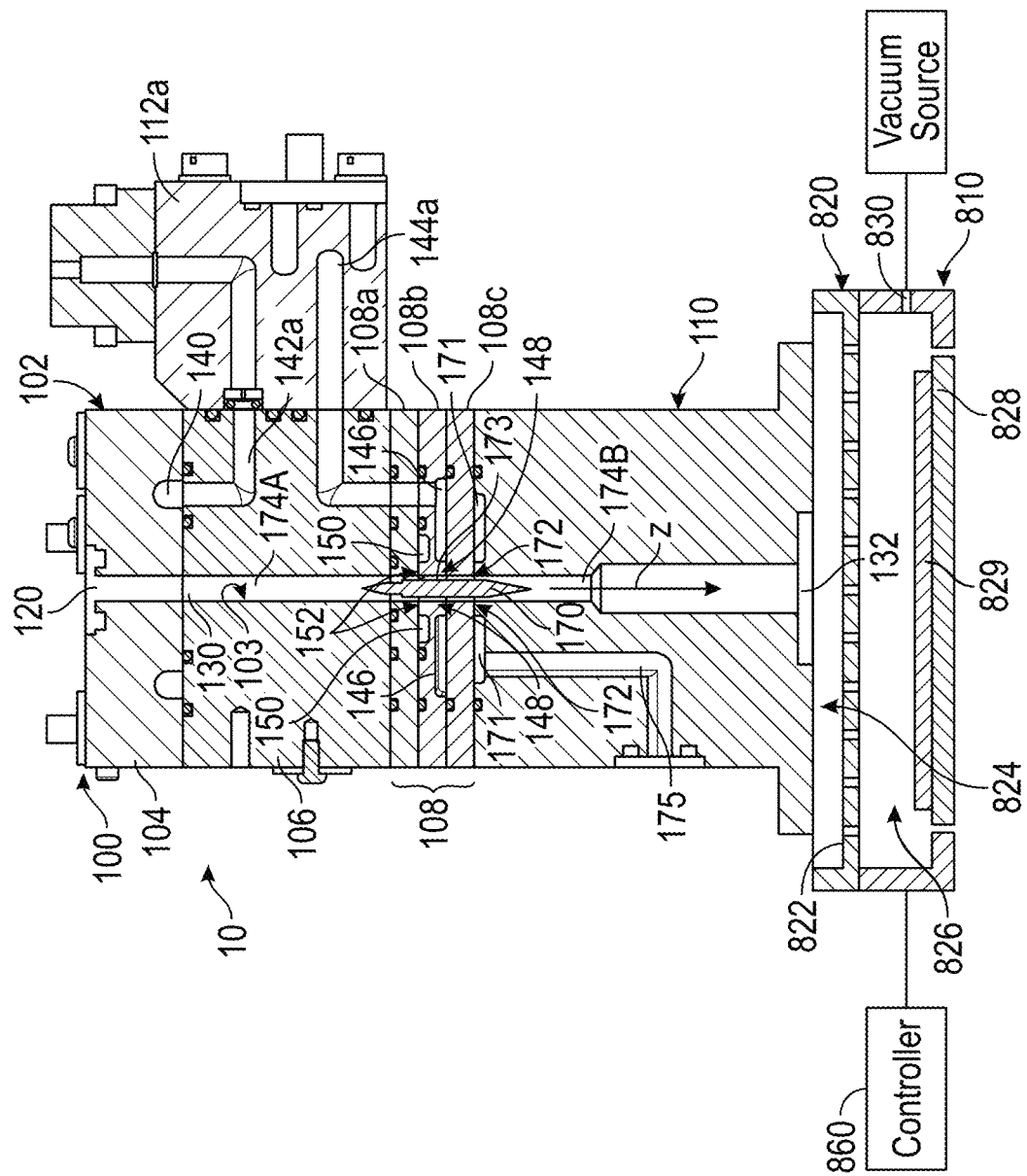
FIGS. 4A-4F illustrate another embodiment of a semiconductor device, in which the bore comprises a channel with an annular flow portion and a non-annular flow portion.
Figure 4B:
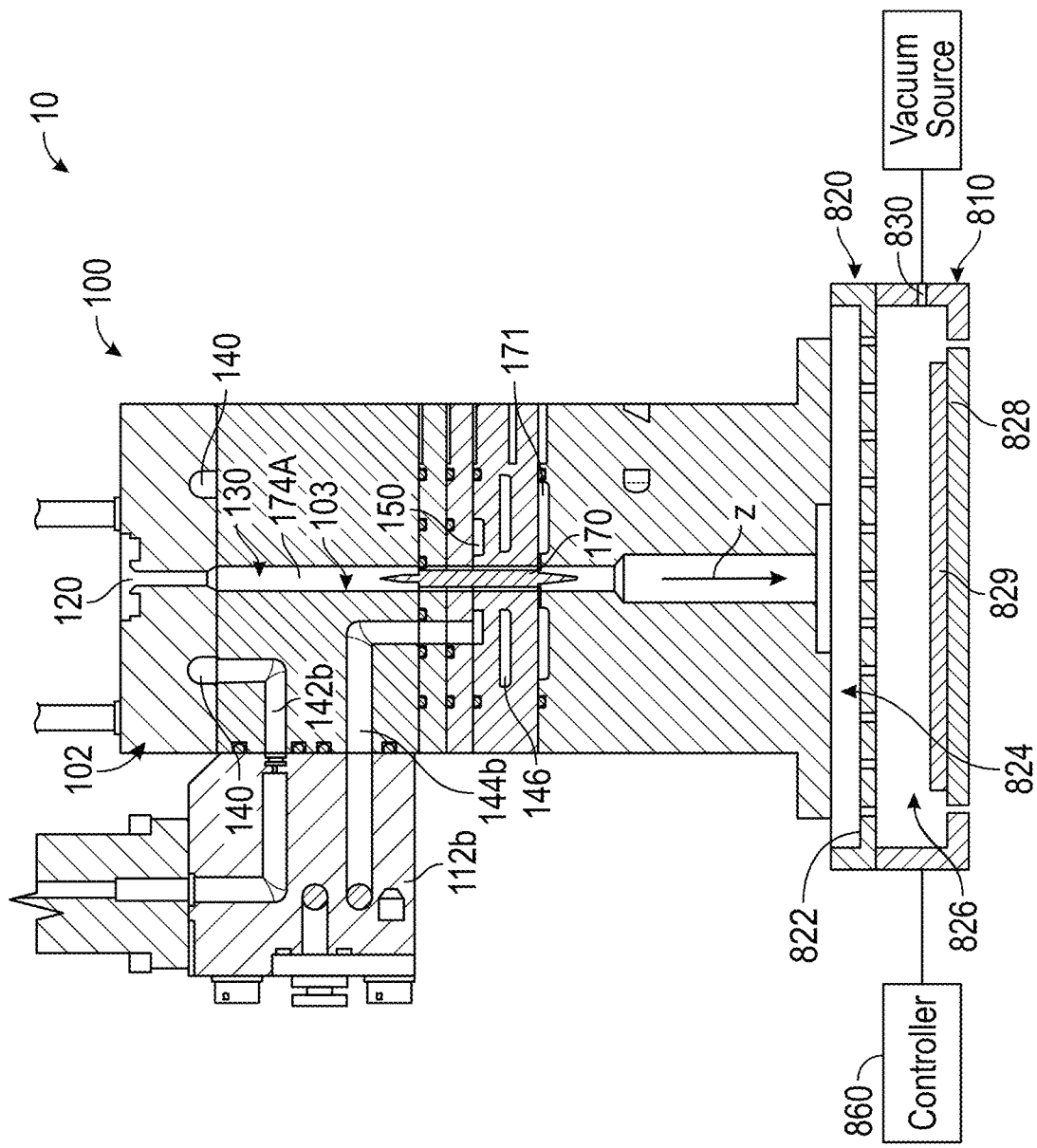

In particular, FIG. 4A is a schematic side cross-sectional view of a semiconductor device 1 including the manifold 100 of FIG. 2, taken along the cross-section labeled 4A-4A. FIG. 4B is a schematic side cross-sectional view of the semiconductor device 1 of FIG. 4A, taken along the cross-section labeled 4B-4B in FIG. 2. The gas sources 850*a*-850*c*, 855 and valves 114*a*-114*b*, 116*a*-116*b* are not shown in FIGS. 4A-4B for ease of illustration, but it should be appreciated that the channels in FIGS. 4A-4B can be connected to gas sources and valves in a manner similar to that shown in FIGS. 3A-3D.

In FIGS. 4A and 4B, the manifold body 102 can comprise an inert gas distribution channel 140 which communicates with an inert gas source (such as source 855) and with valves 114*a*-114*b*, 116*a*-116*b* by way of passageways 142*a*, 142*b* (see FIG. 3A). In addition, as with FIG. 3A, the manifold body 102 can comprise a first distribution channel 146 and a second distribution channel 150. The first and second distribution channels 146, 160 can be disposed at least partially about the longitudinal axis Z of the manifold 100, and can be in fluid communication with corresponding reactant gas sources (such as the sources 850*a*-*c*) and with the inert gas source, by way of passageways 144*a*, 144*b* and the reactant and inert gas valves. As explained above with respect to FIG. 3A, the inert gas valves 114*a*-114*b* and the reactant gas valves 116*a*-116*b* can be selectively activated to supply inert gas and/or reactant gas to the bore 130. For example, as explained above with respect to FIGS. 3A-3D, the supply channels 148, 152 can supply the gas to the bore 130 by way of corresponding slits 105*a*, 105*b* through the inner wall 103 of the bore 130. The slits 105*a*, 105*b* can be revolved around the longitudinal axis Z to define an at least partial annulus (e.g., a complete annulus) in the wall 103 of the bore 130.

Unlike the embodiment of FIGS. 3A-3D, the lower block 108 can comprise three sub-blocks 108*a*, 108*b* 108*c*, in which the distribution channels 146, 150 and supply channels 148, 152 are formed. For example, as shown in FIG. 4A, the distribution channel 150 and supply channel 152 can be defined by a lower surface of the sub-block 108*a* and an upper surface of the sub-block 108*b*. The distribution channel 146 and supply channel 148 can be defined by a lower surface of the sub-block 108*b* and an upper surface of the sub-block 108*c*.

In addition, as shown in FIGS. 4A-4B, a third distribution channel 171 can be defined in the diffusion block 110, e.g., the channel 171 can be defined by a lower surface of the sub-block 108*c* and an upper surface of the diffusion block 110. The third distribution channel 171 can be revolved at least partially (e.g., entirely or partially) about the longitudinal axis Z and can be in fluid communication with a gas source (such as the reactant source 850*a*-850*c* and/or the inert gas source 855) by way of a passageway 175. As with the distribution channels 146, 150, the distribution channel 171 can supply gas to the bore 130 by way of a supply channel 172, which may be generally similar to the supply channels 148, 152. For example, the supply channel 172 can comprise a slit having an at least partially annular gap through the inner wall 103 of the bore 130. The slit and gap can be revolved about the longitudinal axis Z as with the supply channels 148, 152 described herein.

Unlike the embodiment of FIGS. 3A-3D, the device 10 shown in FIGS. 4A-4B comprises an upstream non-annular flow pattern in an upstream non-annular flow portion 174A of the bore 130, an annular flow portion in an annular flow portion 173 of the bore 130, and a downstream non-annular flow pattern in a downstream non-annular flow portion 174B of the bore 130. By contrast, the device 10 in FIGS. 3A-3D can comprise a non-annular flow portion through the length of the bore 130. As shown in FIGS. 4A-4B, a plug 170 can be disposed within the bore 130 in the annular flow portion 173 of the bore 130. As explained herein, the plug 170 can cooperate with the inner wall 103 of the manifold 100 to create an at least partially annular flow pathway as viewed in cross-section of the bore 130.

As used herein, the non-annular flow pattern and the non-annular flow portions 174A, 174B can comprise any suitable non-annular cross-section of the bore 130. For example, the non-annular flow portions 174A, 174B can define a rounded (e.g., circular or elliptical) or a polygonal cross-section in which the gases fill the entire cross-section, e.g., there is no plug or obstruction in the non-annular flow portions 174A, 174B. Rather, the gases flow through the entire cross-section of the bore 130.

By contrast, the annular flow pattern and annular flow portion 173 can comprise an annular cross-section of the bore 130, in which an interior region of the bore 130 is partially occluded so as to enable the gases to flow along the longitudinal axis Z through an annular region bounded by the inner wall 103 of the manifold 130 and an obstruction within the bore 130, e.g., the plug 170. The annular flow pattern and the cross-section of the annular portion 173 can be rounded (e.g., bounded by concentric circles or ellipses), polygonal (e.g., bounded by concentric polygons), or any other suitable annular shape. The annular cross-section may be symmetric in some embodiments. In other embodiments, the annular cross-section may be asymmetric.

Figure 4C:
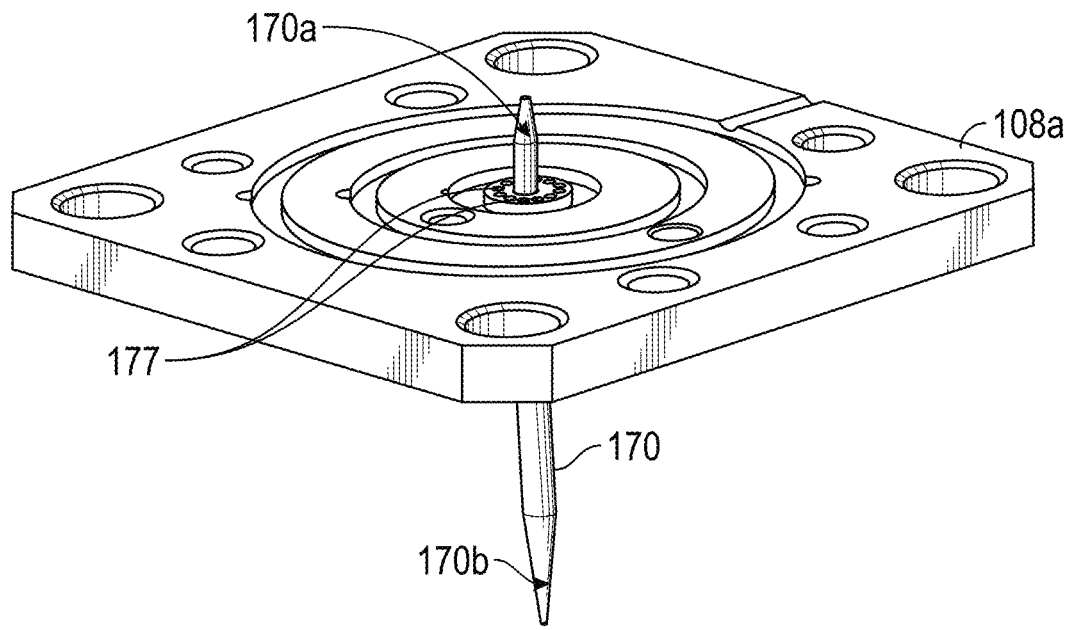
Figure 4D:
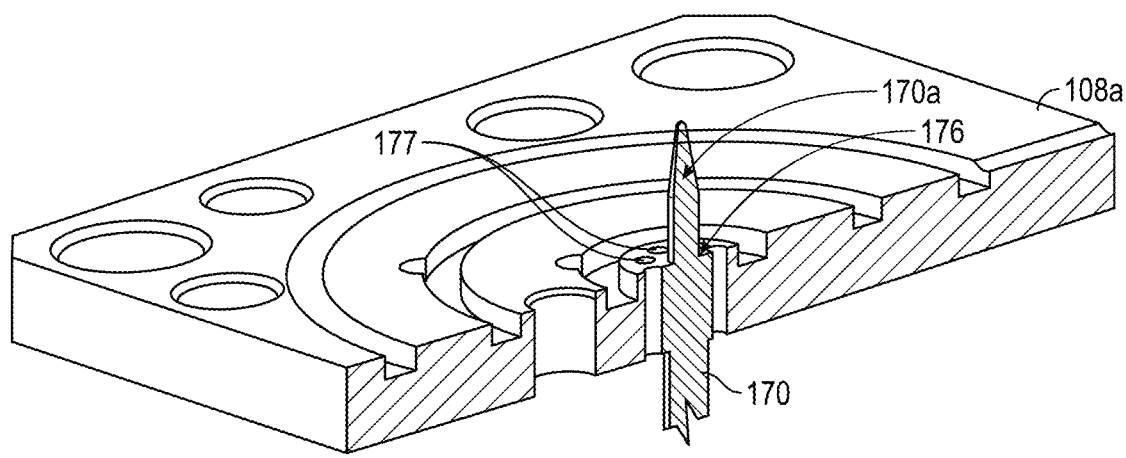

FIG. 4C is a schematic perspective view of the plug 170 coupled with the sub-block 108*a* of lower block 108. FIG. 4D is a schematic perspective cross-sectional view of the plug 170 and sub-block 108*a* of FIG. 4C. Beneficially, the manifold body 102 can be formed of multiple blocks and sub-blocks, as explained herein. The modularity with which the manifold body 102 can be constructed enables the introduction of useful components such as the plug 170 shown in FIGS. 4C and 4D. For example, as shown in FIGS. 4C and 4D, the sub-block 108*a* can include an opening 176 through which the plug 170 is disposed. In some embodiments, the plug 170 can be connected to the sub-block 108*a* by way of an adhesive or fastener. In some embodiments, the plug 170 can be fitted into the opening 176 by way of an interference or friction fit. In still other embodiments, the plug 170 can comprise a nail-like feature, in which an upstream flange extends over the upper surface of the sub-block 108a to secure the plug 170 to the sub-block 108a.

Moreover, as shown in FIGS. 4C-4D, the sub-block 108a can include a plurality of holes 177 disposed about the opening 176 and the plug 170. Thus, gases supplied upstream of the sub-block 108a can pass around an upstream tapered portion 170A of the plug 170. The upstream tapered portion 170A of the plug 170 can create a transition from non-annular flow to annular flow. As the gases approach the upstream tip of the tapered portion 170A, the gases can be divided into an at least partially annular flow pattern. The holes 177 can enable upstream gases to pass through the sub-block 108a and around the plug 170. A downstream tapered portion 170B of the plug 170 can transition the gases from annular flow to non-annular flow.

Figure 4E:
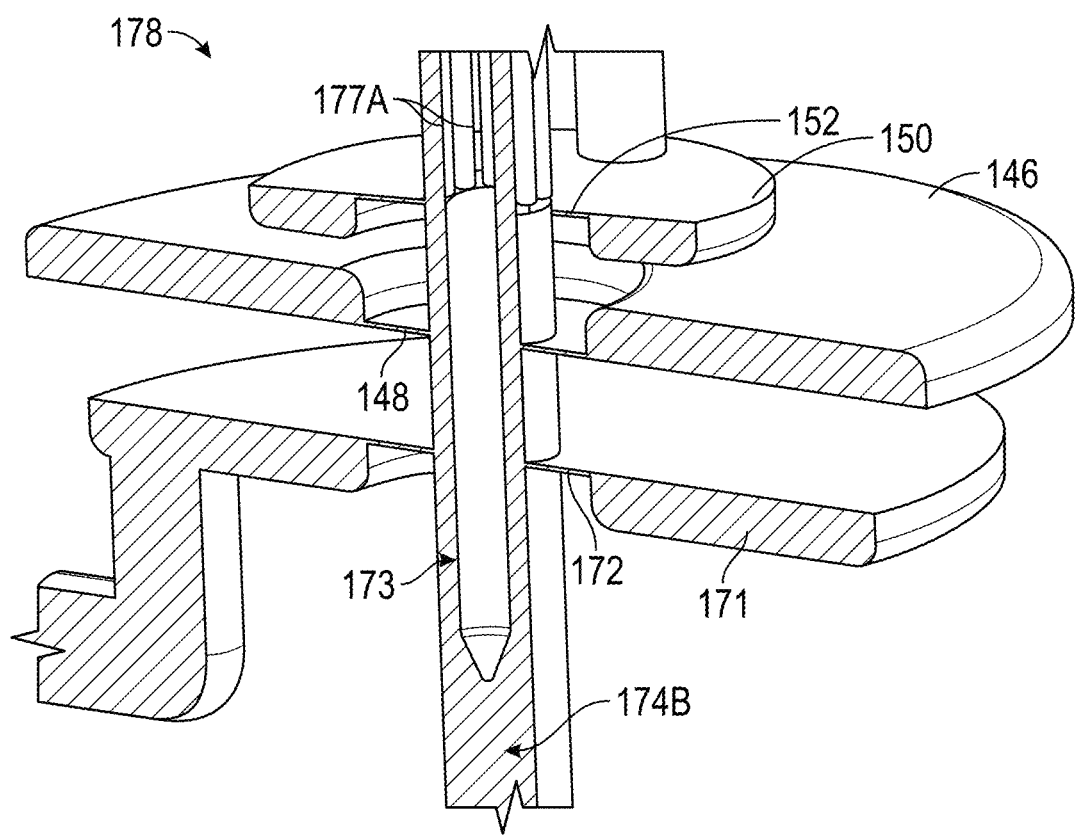

FIG. 4E is a schematic perspective cross-sectional view of a flow pathway 178 defined through the distribution channels 146, 150, 171 and supply channels 148, 152, 172. In particular, FIG. 4E is a negative of a portion of the manifold body 102, insofar as the channels through which gas is supplied is illustrated rather than the structure (e.g., the manifold 100) which defines the channels. As shown in FIG. 4E, at an upstream portion of the flow pathway 178, the gas can flow along an at least partial annular pathway 173 through hole channels 177A defined by the holes 177 of FIGS. 4C-4D. As explained above, the holes 177 can enable the gases to flow through the sub-block 108a. Gas from the distribution channel 150 can be supplied to the annular portion 173 of the bore 130 by way of the supply channel 152, which can comprise the slit 105b. Gas from the distribution channel 146 can be supplied to the annular portion 173 of the bore 130 by way of the supply channel 148 comprising the slit 105a. Similarly, gas from the distribution channel 171 can be supplied to the annular portion 173 of the bore 130 by way of the supply channel 172 which can comprise a slit 105c.

The at least partial annular portion 173 shown in FIG. 4E is a complete annulus (i.e., revolved about the longitudinal axis Z by 360°, but in other embodiments, the portion 173 can comprise a partial annulus defining a revolution between 90° and 360°, between 120° and 360°, between 180° and 360°, between 240° and 360°, etc. As shown in FIG. 4E, the annular portion 173 can transition into the downstream non-annular pathway 174B, and the gases can be conveyed to the reaction chamber 510 as explained herein.

Figure 4F:
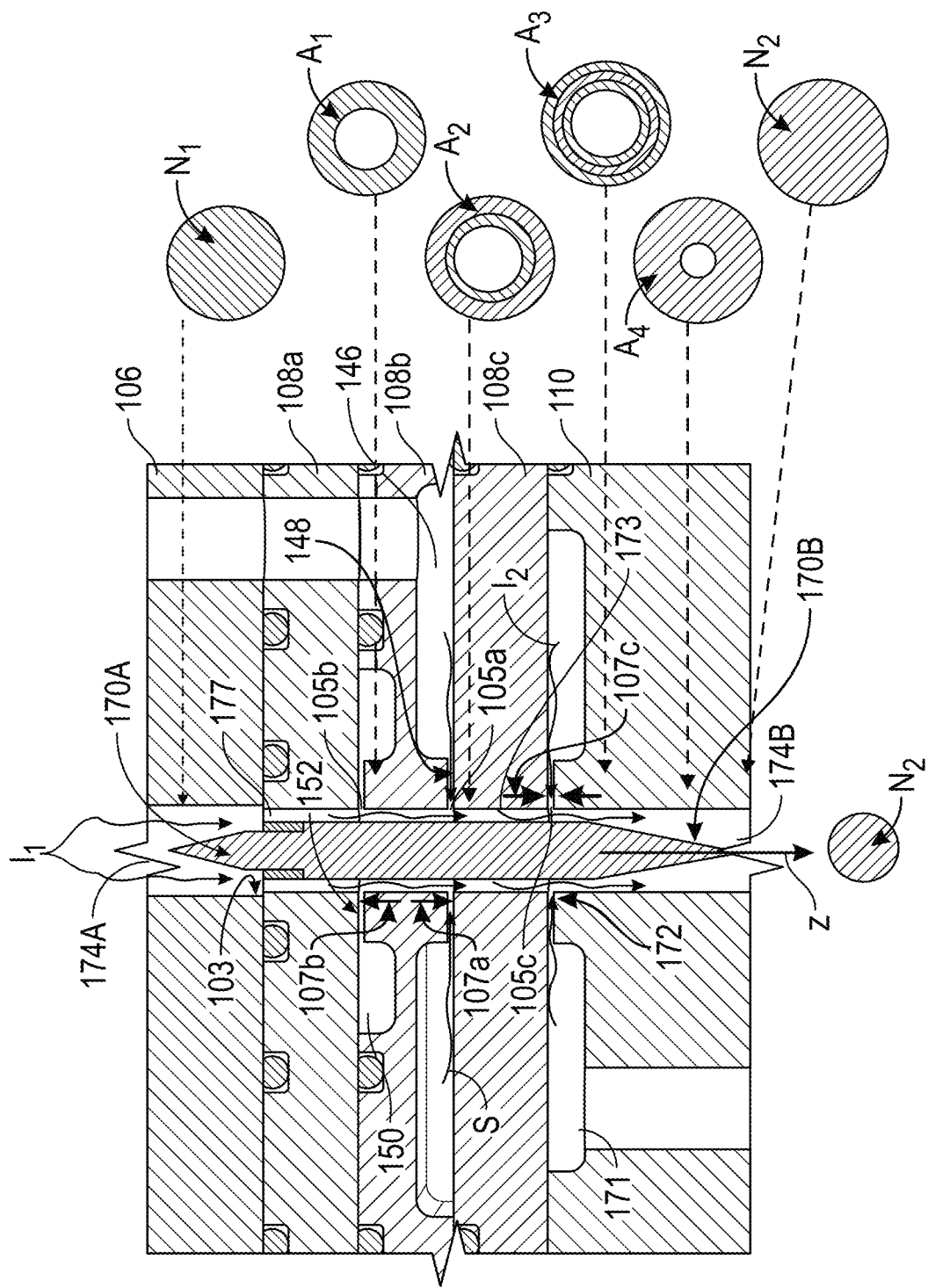

FIG. 4F is a magnified, schematic side cross-sectional view of the manifold body 102, illustrating the upstream non-annular flow portion 174A, the annular flow portion 173, and the downstream non-annular flow portion 174B. As shown in FIG. 4F, a first inert gas $I_1$ (such as Argon) can be supplied through the inlet 120. The first inert gas $I_1$ can flow along the longitudinal axis Z through the non-annular flow portion 174A of the bore with a non-annular flow cross-section. As shown on the right side of FIG. 4F, the gases flowing through the non-annular portion 174A can have a non-annular cross-sectional flow profile $N_1$, in which the first inert gas $I_1$ flows through the entire volume bounded by the inner wall 103 of the bore 130. Thus, the flow profile $N_1$ does not have any barriers or plugs in the interior of the bore 130.

The first inert gas $I_1$ can transition from non-annular flow to at least partially annular flow (e.g., complete annular flow) within the annular flow portion 173 when the first inert gas $I_1$ encounters the downstream tapered portion 170A of the plug 170. The first inert gas $I_1$ can pass through the holes 177 and can travel downstream along the annular flow portion 173 about the outer periphery of the plug 170, e.g., between the outer periphery of the plug 170 and the inner wall 103 of the manifold body 102. As shown in a first annular flow profile $A_1$, the first inert gas $I_1$ can uniformly fill the annular space provided between the plug 170 and the inner wall 103 of the manifold body 102.

During an example pulse of gas to the device 10, a source gas S can be supplied to the annular portion 173 of the bore 130 by way of the distribution channel 146 and the supply channel 148. For example, as explained above, the source gas S (e.g., a reactant gas) can be delivered from the wider distribution channel 146 to the narrow slit 105a by way of backpressure built up in the channel 146. As shown in a second annular flow profile $A_2$, the source gas S can enter uniformly about the wall 103 such that source gas S can push the inert gas $I_1$ radially inward. In the second annular flow profile $A_2$, the source gas S can be disposed concentrically about the inert gas $I_1$. Beneficially, the annular flow portion 173 can promote mixing between the source gas S and the first inert gas $I_1$, at least in part because the constricted area provided by the flow portion 173 causes the source gas S and the first inert gas $I_1$ to intermix together.

A second inert gas $I_2$ (such as argon) can be supplied to the annular flow portion 173 of the bore 130 by way of the third distribution channel 171 and the supply channel 172, which can comprise a narrow slit 105c defining an at least partially annular gap 107c through the wall 103 of the bore 130. Advantageously, the second inert gas $I_2$ can push the source gas S and the first inert gas $I_1$ towards the outer periphery of the plug 170 to enhance mixing. As shown in FIG. 4F, a third annular flow profile $A_3$ can be defined in the annular portion 173 in which the source gas S is disposed annularly between the first and second inert gases $I_1$, $I_2$. The constricted annular portion 173 can enhance missing among the source gas S and the inert gases $I_1$, $I_2$, as shown in a fourth annular flow profile $A_4$ disposed about the downstream tapered portion 170B of the plug 170.

The mixed gases can transition from an annular flow profile $A_4$ to a second non-annular profile $N_2$ downstream of the plug 170. As the mixed gases emerge into the downstream non-annular portion 174B, the gases can be sufficiently mixed so as to provide a substantially uniform concentration and/or thickness on the substrate. Thus, the embodiment shown in FIGS. 4A-4F can improve the mixing and reduce non-uniformities associated with other types of flow manifolds. The restricted flow paths defined by the annular portion 173 of the bore 130 can facilitate improved mixing of any number and type of gases. The embodiment of FIGS. 3A-3D and 4A-4F can result in an average deposition non-uniformity of less than 5%, e.g., less than 2% (e.g., about 1.8%), as compared with the pattern of FIG. 1C which can result in an average non-uniformity of about 14%.

Figure 5A:
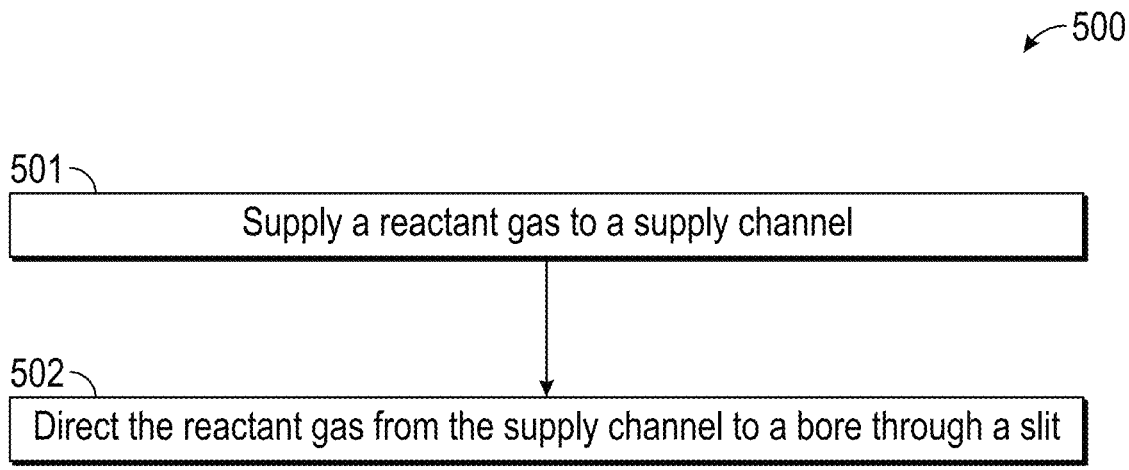
FIGS. 5A and 5B are flowcharts illustrating example deposition methods, according to various embodiments.

FIG. 5A is a flowchart illustrating a method 500 of depositing a film on a substrate. The method 500 begins in a block 501 to supply a reactant gas through a supply channel to a bore of a manifold. As explained herein, a distribution channel can convey gas from a source (such as a source of reactant or inert gas) to the supply channel. The distribution channel can be annularly disposed about a longitudinal axis of the manifold.

In a block 502, the reactant gas can be directed from the supply channel to the bore through a slit. The slit can define an at least partially annular gap along an inner wall of the bore. The at least partially annular gap can be revolved around the longitudinal axis. For example, the slit can comprise a full annulus revolved 360° about the longitudinal axis. In other embodiments, the slit can comprise a partial annulus revolved only partially about the longitudinal axis.

As explained herein, the at least partially annular gap can comprise a thickness that is significantly smaller than a circumferential or peripheral length of the gap along the wall of the manifold. Beneficially, as explained herein, the slit can provide relatively uniform gas flow to the bore. In some embodiments, as explained herein, a plug can be provided to define an at least partially annular flow path. Non-annular flow paths can be provided upstream and downstream of the at least partially annular flow path.

Figure 5B:
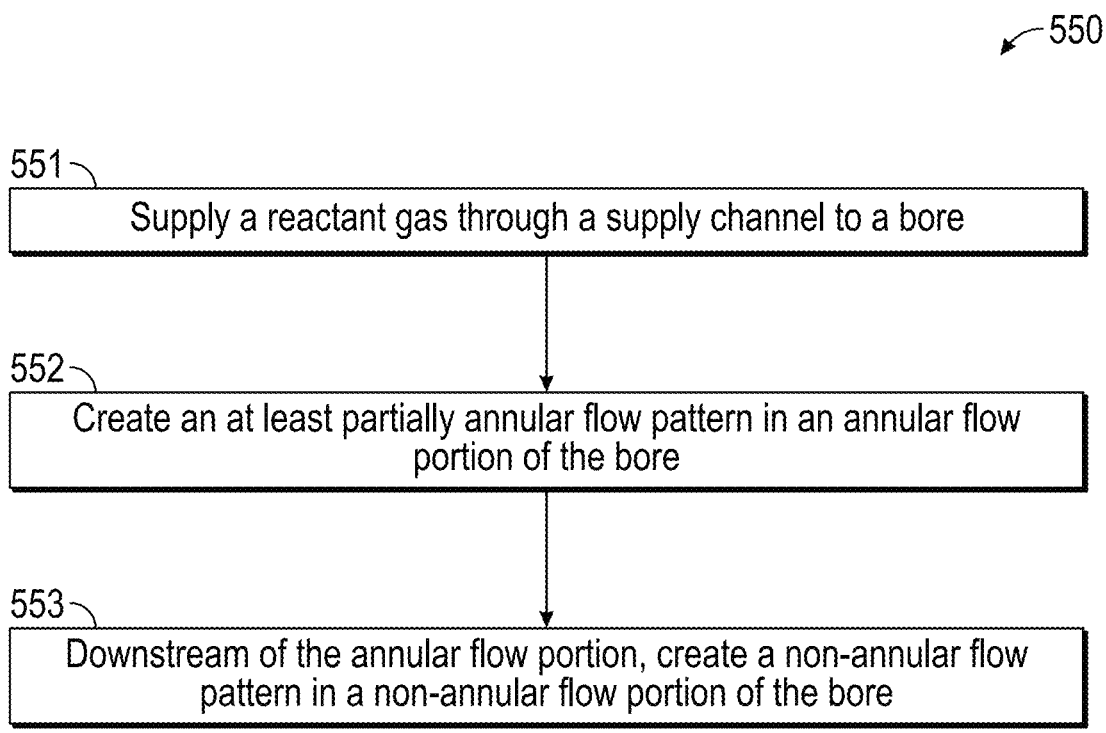

FIG. 5B is a flowchart illustrating a method 550 of depositing a film on a substrate, according to various embodiments. The method 550 begins in a block 551 to supply a reactant gas through a supply channel to a bore of a manifold. As explained herein, a distribution channel can convey gas from a source (such as a source of reactant or inert gas) to the supply channel. The distribution channel can be annularly disposed about a longitudinal axis of the manifold in some embodiments.

Moving to a block 552, an at least partially annular flow pattern can be created in an annular flow portion of the bore such that the reactant gas flows along a longitudinal axis of the manifold with an at least partially annular cross-section. For example, in some embodiments, the at least partially annular flow pattern can be defined by a plug (such as the plug 170) disposed within the bore. The plug can partially obstruct the bore to divide the gas flow such that the gas flows about an outer periphery of the plug. As explained herein, upstream of the at least partially annular cross-section, the gas can flow in an upstream non-annular flow pattern. When the gas reaches the annular flow portion, the gas can flow around the outer periphery of the plug. The constricted area provided by the annular flow pathway can beneficially enhance the mixing of gases flowing through the bore.

In a block 553, downstream of the annular flow portion, a non-annular flow portion can be created in a non-annular portion of the bore such that the reactant gas flows along the longitudinal axis with a non-annular cross-section. As explained herein, the plug can comprise upstream and downstream tapered portions that can enable the transition of the gas flow from non-annular to annular, and from annular to non-annular. The convergence of the annular gas pathway into a downstream non-annular portion can further enhance mixing of supplied gases, which can advantageously improve device yield.

III. Manifolds with Extended Mixing Length

Various embodiments disclosed herein can enable reduce deposition non-uniformity and improve mixing by extending the mixing length along the bore 130 downstream of the location(s) at which gases are supplied to the bore 130. For example, in some embodiments, a semiconductor processing device can comprise a manifold comprising a bore therein. The bore can define a gas passageway between a first end portion of the manifold and a second end portion of the manifold. The first end portion can be disposed opposite to and spaced from the second end portion along a longitudinal axis of the manifold by a first distance. The gas passageway can extend through the manifold for a second distance larger than the first distance. For example, in some embodiments, the second distance can be at least 1.5 times the first distance, at least 2 times the first distance, at least 3 times the first distance, or at least 5 times the first distance. In some embodiments, the second distance can be in a range of 1.5 times to 10 times the first distance, e.g., in a range of 2 times to 5 times the first distance. A reaction chamber can be disposed downstream of and in fluid communication with the bore.

In some embodiments, a semiconductor processing device can include a manifold comprising a bore having an axial portion that defines a longitudinal axis of the manifold and a lateral portion extending non-parallel to the longitudinal axis. A supply channel that supplies gas to the axial portion of the bore can be disposed at a first location along the longitudinal axis. The lateral portion can be disposed at a second location downstream of the first location. The lateral portion can extend non-parallel relative to the longitudinal axis. A reaction chamber can be disposed downstream of and in fluid communication with the bore.

Figure 6A:
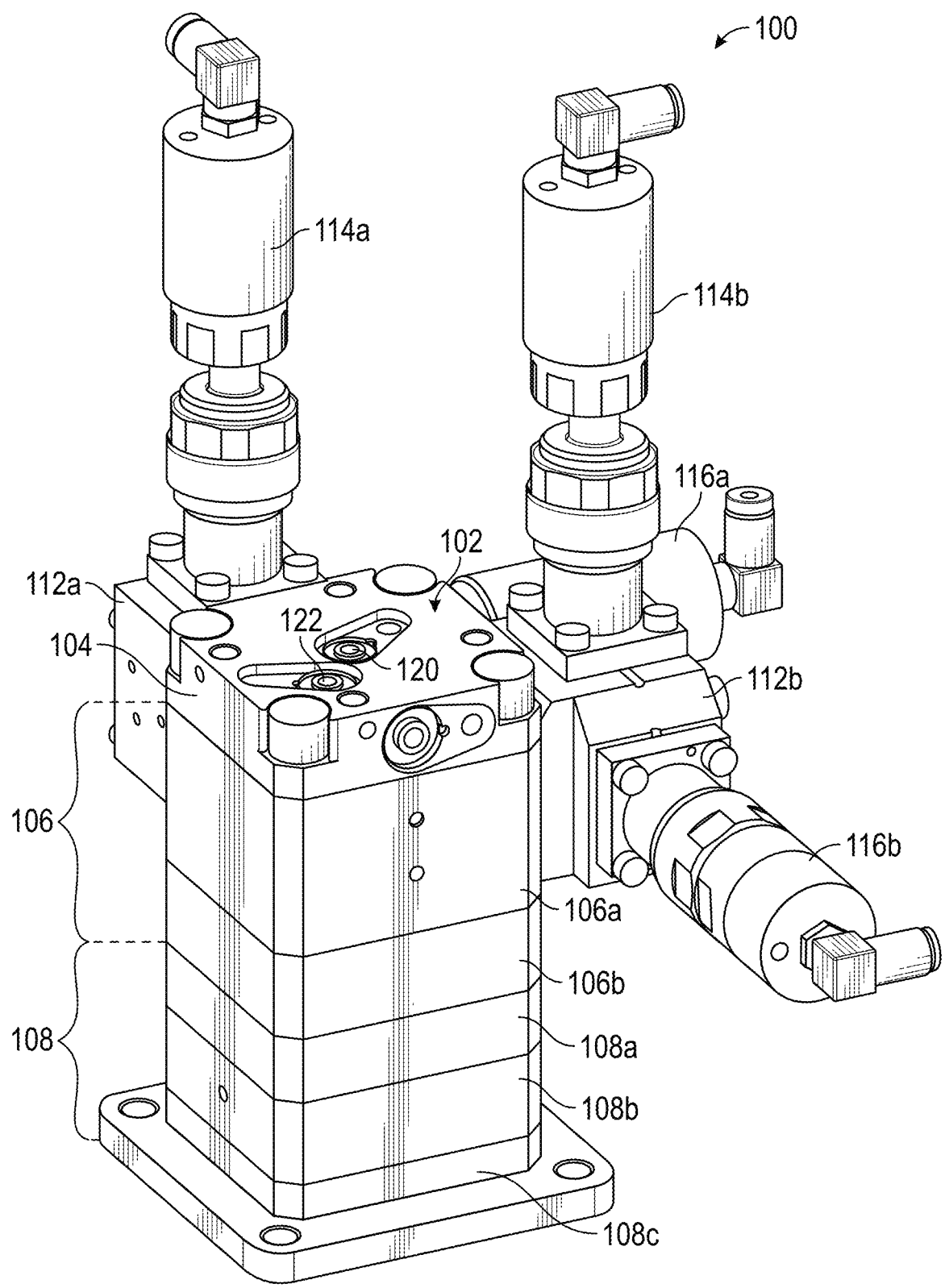
Figure 6B:
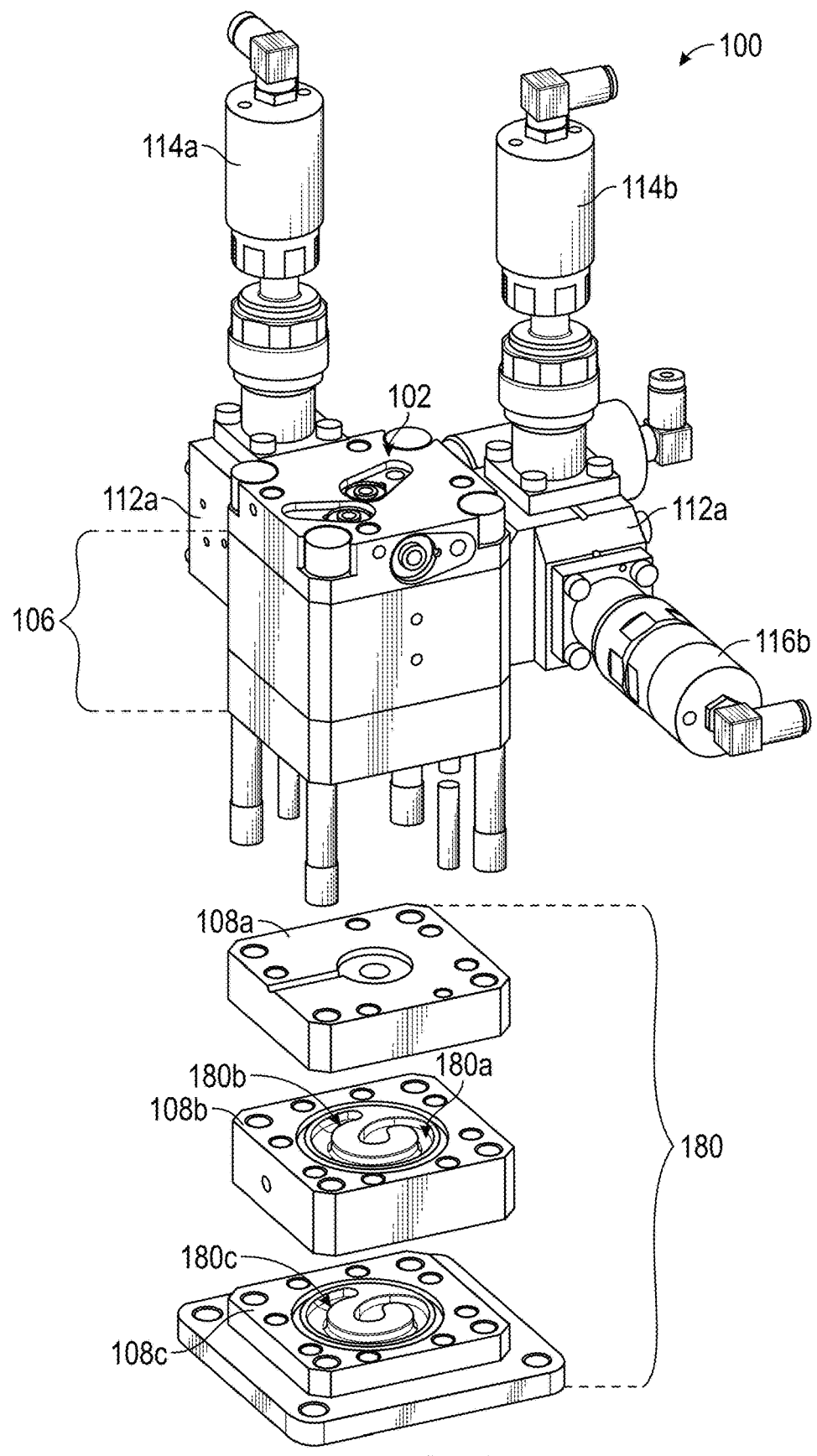

FIGS. 6A-6J illustrate an embodiment of a semiconductor processing device 10 in which the manifold 100 has an extended mixing length. Unless otherwise noted, reference numerals in FIGS. 6A-6J refer to components that are the same as or similar to like numbered components from FIGS. 2-4F. For example, FIG. 6A is a schematic perspective view of the manifold 100 with an extended mixing length. FIG. 6B is a schematic perspective exploded view of the manifold 100 of FIG. 6A. The manifold 100 can include a manifold body 102 connected with valve blocks 112a, 112b. Reactant valves 116a, 116b and inert gas valves 114a, 114b can be disposed on the blocks 112a, 112b. Inert gas inlets 120, 122 can supply inert gas to the manifold 100. The manifold body 102 can comprise multiple blocks 104, 106, 108. Unlike the embodiment of FIGS. 3A-4F, the intermediate block 106 can comprise a sub-block 106a and a sub-block 106b. The lower block 108 can comprise a first sub-block 108a, a second sub-block 108b, and a third sub-block 108c. As explained above, the use of multiple blocks and sub-blocks can enable a modular construction of the manifold 100 which can enable the use of internal channels with curved shapes and other internal lumens.

Beneficially, as explained herein, the sub-blocks 108a-108c can define an extending mixing length pathway 180 having a first lateral portion 180a, an offset axial portion 180b, and a second lateral portion 180b. As explained herein, the pathway 180 can provide an extended mixing length downstream of where the supply gases are introduced to the bore 130.

Figure 6C:
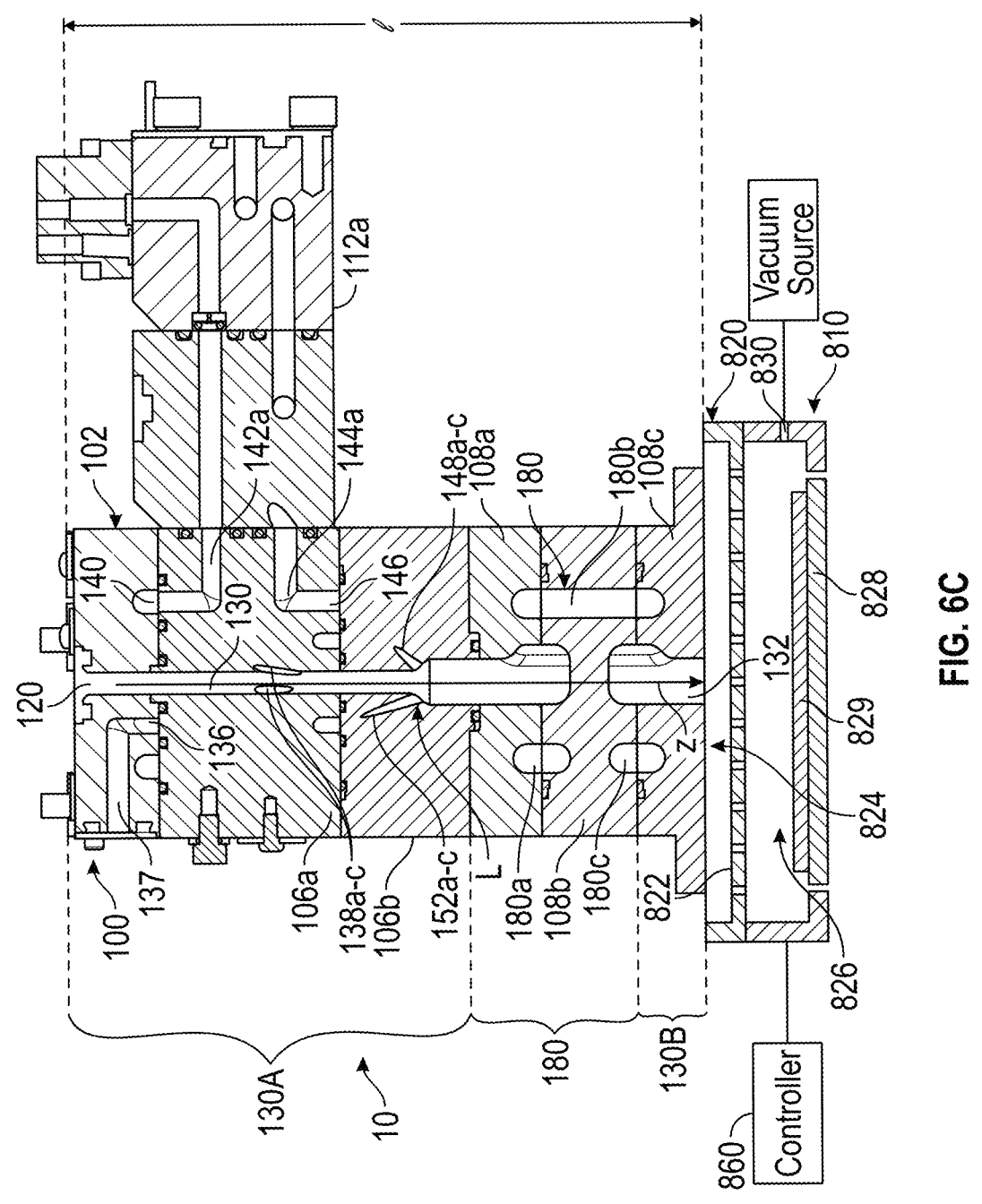

FIG. 6C is a schematic side cross-sectional view of a semiconductor processing device 10 that includes the manifold 100 of FIGS. 6A-6B and a reaction chamber 810. As with FIGS. 1A and 2-4F, the manifold 100 can include gas distribution channels 136, 150, and 146, in addition to an inert gas distribution channel 140. Supply channels 138a-c can convey gases from the distribution channel 136 to the bore 130. Supply channels 152a-c can convey gases from the distribution channel 150 to the bore 130. Supply channels 148a-c can convey gases from the distribution channel 146 to the bore 130. In the embodiment of FIG. 6C, the supply channels 138a-c, 152a-c, 148a-c can comprise angled supply channels similar to those shown in FIG. 1A. In other embodiments, however, the supply channels can comprise the supply channels 138, 148, 152, and/or 172 of FIGS. 3A-4F, which include slits defining an at least partially annular gap about the longitudinal axis Z of the manifold 100. Moreover, in some embodiments, the bore 130 of FIG. 6C can comprise a plug 170 defining an at least partially annular flow pathway through which the gases can flow. Thus, the manifold 100 of FIG. 6C can be used in combination with the slits and/or annular flow portions described in connection with FIGS. 3A-4F.

As explained below in connection with FIGS. 6D-6J, the extended mixing length pathway 180 can extend the mixing length of the bore 130 to enhance mixing. As shown in FIG. 6C, the pathway 180 of the bore 130 can be disposed downstream of the location L at which the most downstream supply channel supplies gas to the bore 130. Thus, as explained herein, the gases supplied by the supply channels 138, 146, 152 may initially mix within an upstream axial portion 130A of the bore 130 which extends along the longitudinal axis Z upstream of the extended mixing length pathway 180.

The pathway 180 can extend the mixing length (and therefore mixing time) of the supplied gases as compared with a bore that extends straight through the manifold 100 along the longitudinal axis Z. As explained herein, the extended length pathway 180 can comprise the first lateral portion 180a which extends non-parallel to and away from the longitudinal axis Z, the offset axial portion 180b which extends generally parallel to, but offset from, the longitudinal axis Z, and the second lateral portion 180c which extends non-parallel to and towards the longitudinal axis Z. The second lateral portion 180c of the bore 130 can transition into a downstream axial portion 130B that extends downstream from the pathway 180 along the longitudinal axis Z to the reaction chamber 810. Although the downstream axial portion 130B is illustrated as being disposed within the manifold 100 for some length, it should be appreciated that the downstream axial portion 130B may comprise a very short length or may comprise a juncture at which the pathway 180 merges with the bore 130 at the inlet to the reaction chamber 810. That is, the second lateral portion 180c may extend laterally towards the axis Z, and an opening in the manifold may provide axial fluid communication directly between the second lateral portion 180c and the reaction chamber 810. In such an embodiment, the downstream axial portion 130B can comprise the opening or aperture which provides axial fluid communication between the pathway 180 and the reaction chamber 810.

Figure 6D:
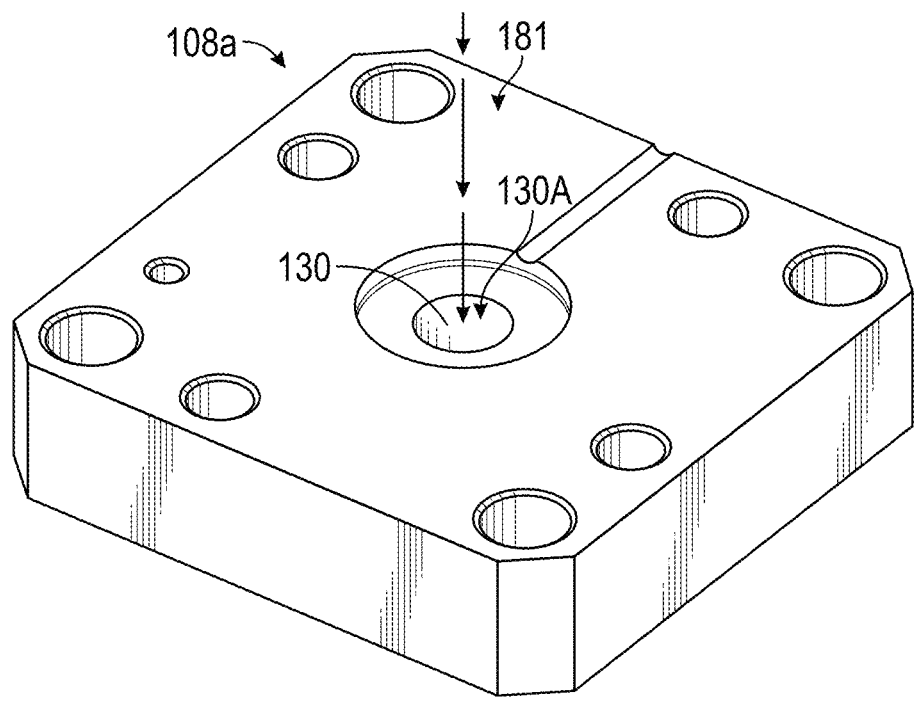
Figure 6E:
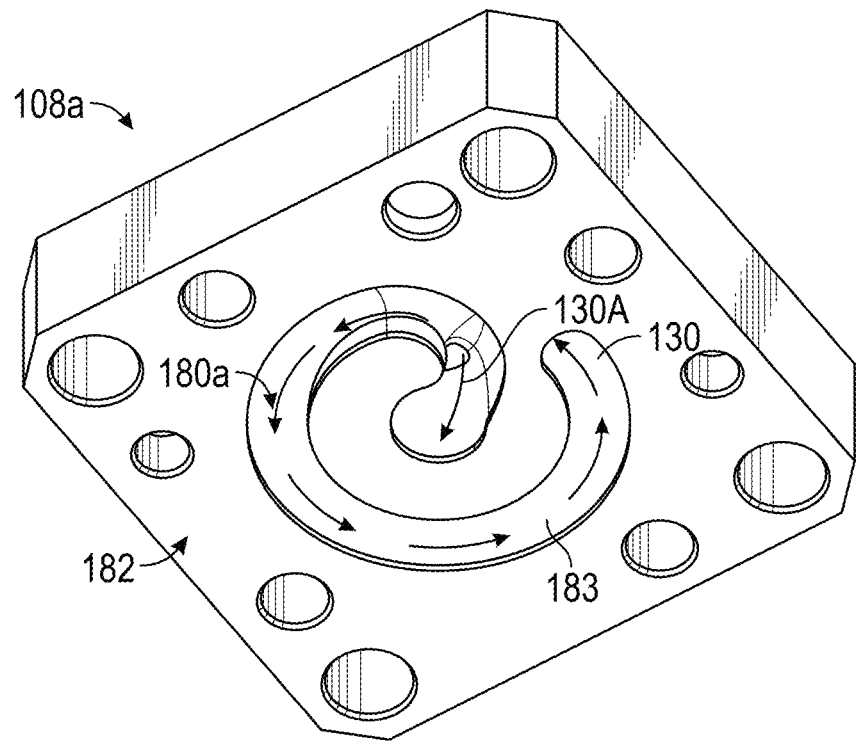
Figure 6F:
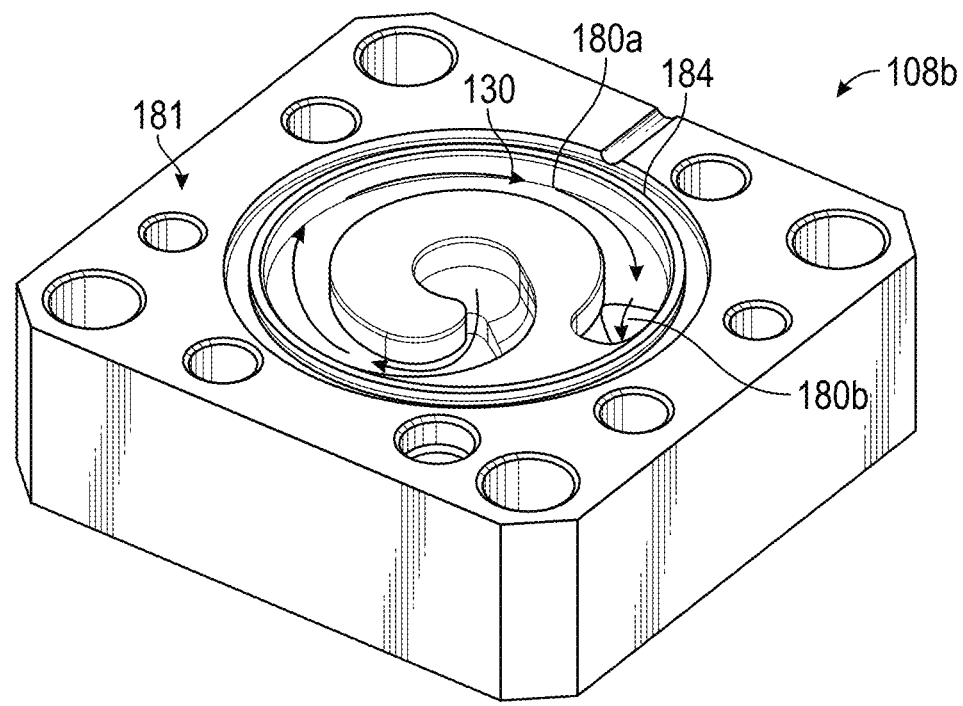
Figure 6G:
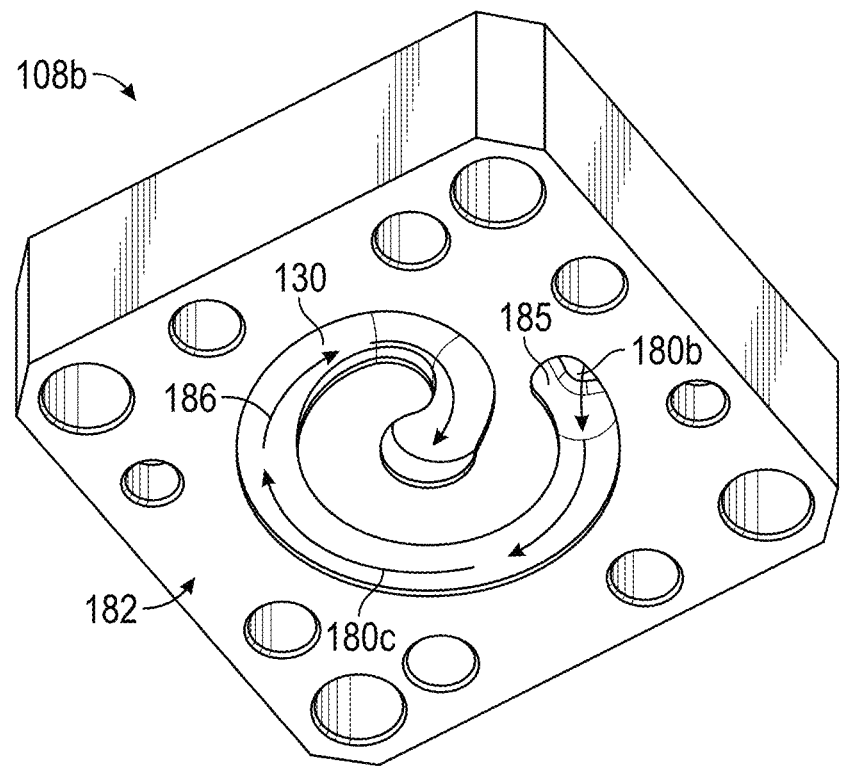
Figure 6H:
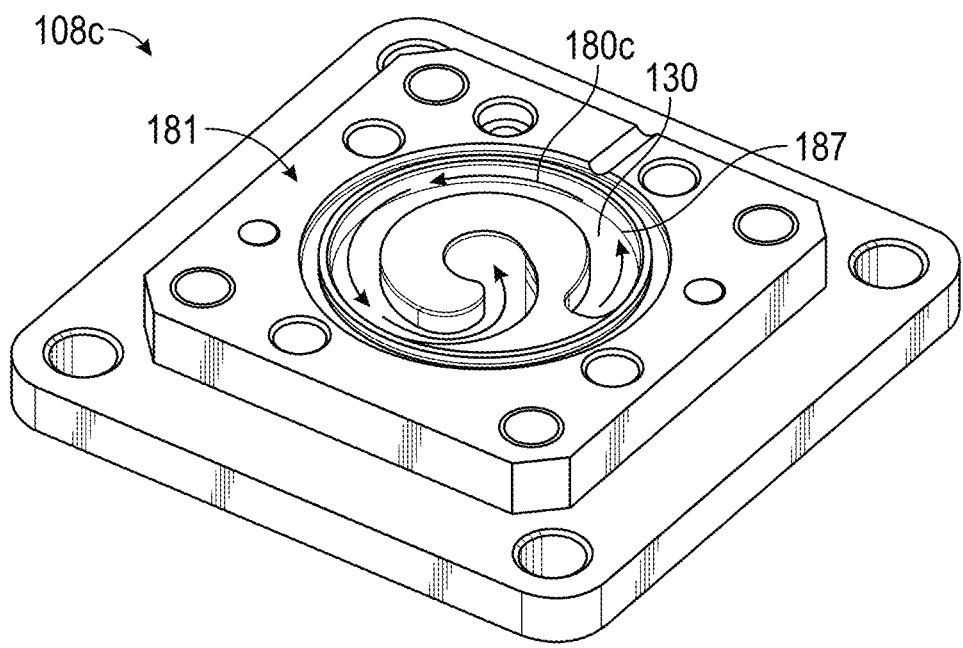
Figure 6I:
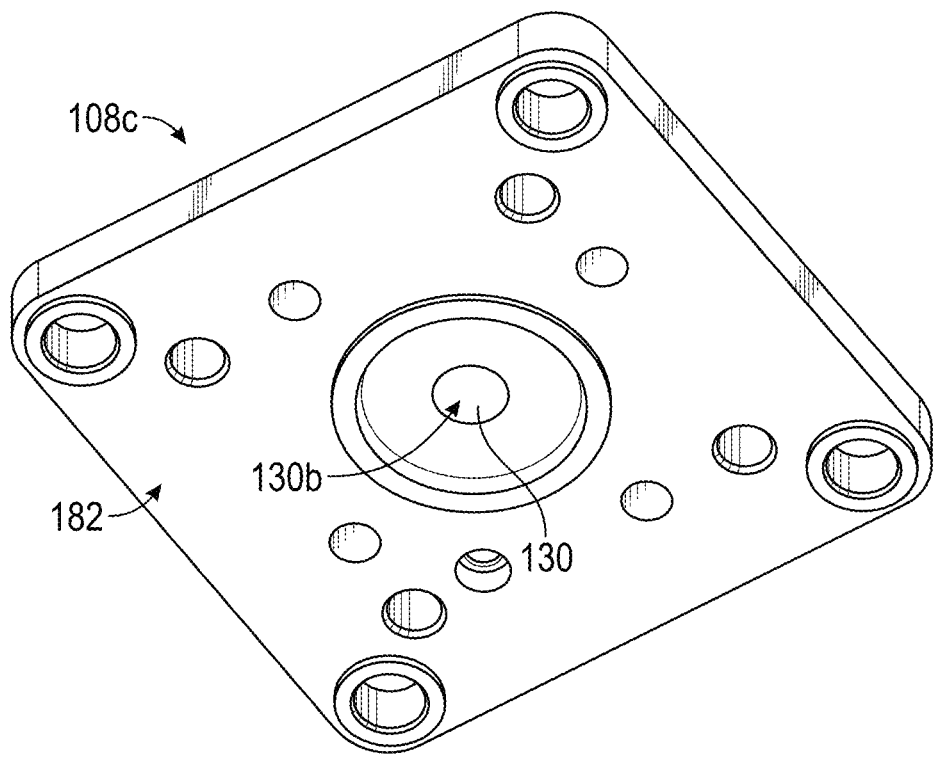
Figure 6J:
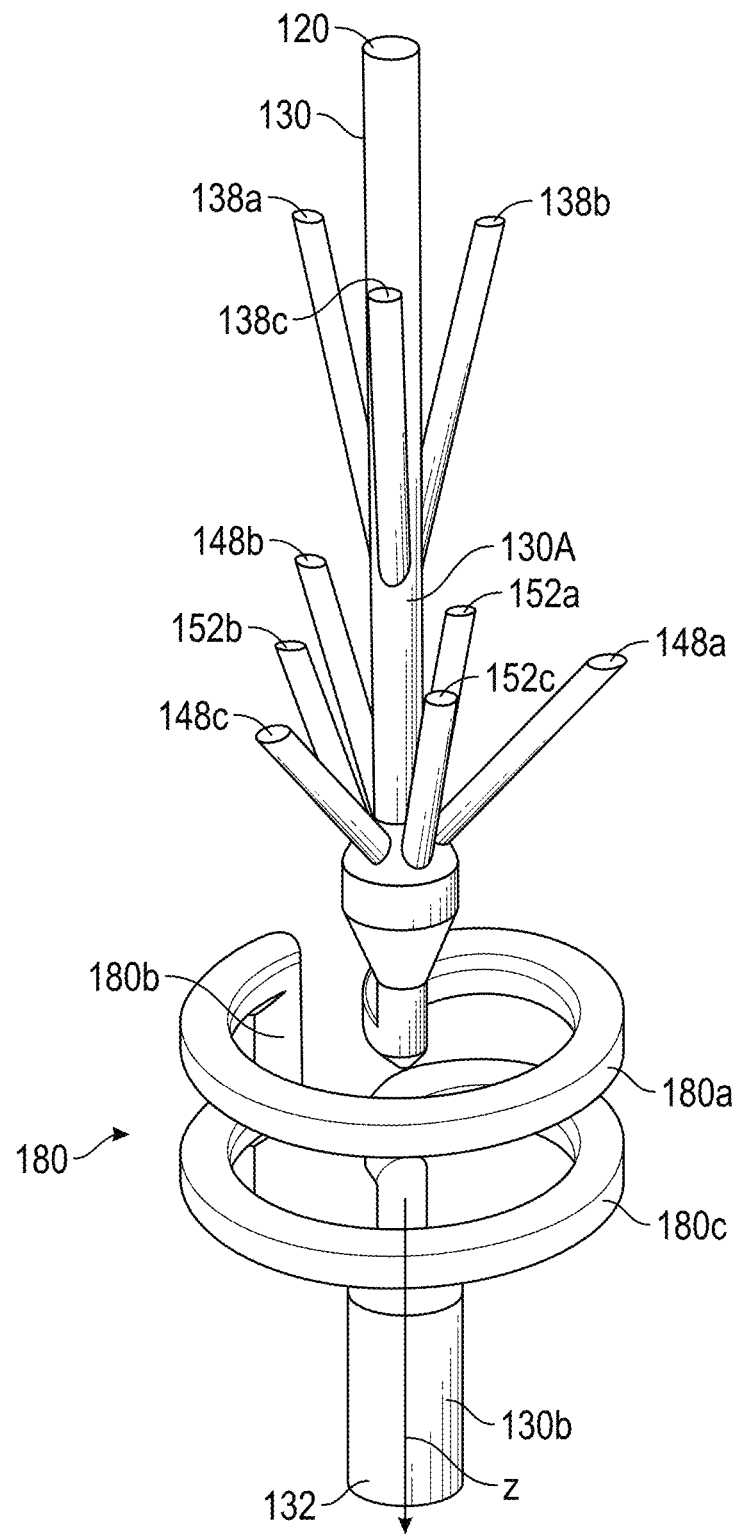

FIGS. 6D-6J illustrate the extended mixing length flow pathway 180 which is disposed downstream of the location L at which the downstream-most supply channel merges with the bore 130. In particular, FIGS. 6A-6I illustrate the pathway 180 through the sub-blocks 108a-108c. FIG. 6J is a schematic perspective view of the flow pathways through the manifold 100.

For example, FIG. 6D is a schematic top perspective view of the first sub-block 108a. FIG. 6E is a schematic bottom perspective view of the first sub-block 108a. As shown in FIGS. 6D and 6J, the bore 130 can comprise an upstream axial flow portion 130A disposed upstream of and terminating in the sub-block 108a. The upstream axial flow portion 130A can extend along the longitudinal axis Z of the manifold 100. Although the longitudinal axis Z of the manifold 100 is illustrated as being disposed perpendicular to the top surface of the manifold 100, in other embodiments, the longitudinal axis Z can be disposed obliquely through the manifold 100. The upstream axial flow portion 130A of the bore 130 can be disposed generally parallel to or along the axis Z. As shown in FIG. 6D, the upstream axial flow portion 130A enters an upper surface 181 of the first sub-block 108a.

In FIGS. 6E and 6J, the upstream axial flow portion 130A can extend axially (i.e., along the longitudinal axis Z) through a portion of a thickness of the sub-block 108a. FIG. 6F is a top schematic perspective view of the second sub-block 108b. When assembled (see FIG. 6C), the first sub-block 108a and the second sub-block 108b can connect together by way of one or more mechanical fasteners. The first and second sub-blocks 108a, 108b can cooperate to define the first lateral portion 180a of the pathway 180 of the bore 130. For example, a lower surface 182 of the first sub-block 108a can comprise a first groove 183 formed through a portion of the thickness of the first sub-block 108a. The upper surface 181 of the second sub-block 108b can comprise a second groove 184 formed through a portion of the thickness of the second sub-block 108b. As shown in FIGS. 6E-6F, the grooves 183, 184 can extend from the axial pathway 130A away from and non-parallel to the longitudinal axis Z. In the illustrated embodiment, the grooves 183, 184 extend perpendicular to the axis Z. As shown in FIGS. 6E-6F, the grooves 183, 184 delimit a spiral pattern, beginning at the axial flow portion 130A and curving outwardly to an outer portion of the sub-blocks 108a-108b.

FIG. 6G is a schematic bottom perspective view of the second sub-block 108b. As shown in FIGS. 6C, 6F, 6G, and 6J, the offset axial portion 180b can be disposed offset from the axis Z and can include a component generally parallel to the axis Z. In the illustrated embodiment, the offset axial portion 180b is disposed generally parallel to the axis Z. In other embodiments, the offset axial portion 180b may not be parallel to the axis Z, but rather may include a directional component parallel to the axis Z, such that the offset axial portion 180b conveys the gas through at least some displacement along the axis Z. As shown in FIGS. 6F and 6G, the offset axial portion 180b can be defined along an axial channel 185 formed through the entire thickness of the sub-block 108b.

FIG. 6H is a schematic top perspective view of the third sub-block 108c. When assembled, the lower surface 182 of the second sub-block 108b can cooperate with the upper surface 181 of the third sub-block 108c to define the second lateral portion 180c of the flow pathway 180, as shown in FIG. 6J. For example, a third groove 186 can be formed in the lower surface 182 of the second sub-block 108b. A fourth groove 187 can be formed in the upper surface 181 of the third sub-block 108c. As shown in FIGS. 6G, 6H, and 6J, the grooves 186, 187 and the second lateral portion 180c can extend non-parallel to and towards the longitudinal axis Z in a spiral pattern. For example, the second lateral flow portion 180c can extend laterally (e.g., non-parallel to the axis Z) from the offset axial channel 185 to a central portion of the sub-block 108c.

FIG. 6I is a schematic bottom perspective view of the third sub-block 108c. As illustrated in FIGS. 6H-6J, the groove 187 of the third sub-block 108c can communicate with the downstream axial flow portion 130B of the bore 130. Gases flowing through the second lateral portion 180c can transition from lateral flow through the pathway 180 to axial flow through the axial portion 130B of the bore 130.

In the illustrated embodiments, the extended length flow pathway 180 extends laterally away from the longitudinal axis Z, extends parallel to but offset from the axis Z, and extends laterally towards the longitudinal axis Z. In the illustrated embodiments, the first and second axial portions 130A, 130B of the bore 130 are generally aligned along the longitudinal axis Z. However, it should be appreciated that in other embodiments, the downstream axial portion 130B may be offset from the longitudinal axis Z. For example, in such embodiments, the reaction chamber 810 and the outlet 132 may be disposed offset from the inlet 120 and the axis Z. Moreover, in the illustrated embodiments, the pathway 180 includes two lateral portions 180a, 180c, and one offset axial portion 180b. In other embodiments, however, additional sub-blocks may be added to provided additional mixing length. For example, in such arrangements, the pathway 180 may comprise any suitable number of lateral portions and offset axial portions. The additional lateral and offset axial portions may further improve the mixing of the supplied gases.

The positioning of the lateral flow portions 180a, 180c, and the offset axial portion 180b can beneficially extend the mixing length of the bore 130 downstream of the location L at which the supply channels enter the bore 130. Extending the mixing length of the bore 130 can also extend the mixing time of the gases supplied to the bore 130, which can improve uniformity of deposition and improve device yield. In particular, the embodiment of FIGS. 6A-6J can provide a mixing non-uniformity of less than 2%, e.g., less than 1%. In some embodiments, the extended mixing length provided by FIGS. 6A-6J can provide a mixing non-uniformity of less than 0.5%, or more particularly less than 0.15%, e.g., about 0.09%.

For example, as shown in FIG. 6C, the manifold 100 can extend along a manifold length l. In some semiconductor devices, such as those illustrated in FIGS. 1-4F, the bore can extend generally along the axis Z from the inlet 120 to the outlet 132. In such arrangements, therefore, the length of the bore can extend from a first end portion at the inlet 120 to a second end portion at the outlet 132 such that the length of the bore is the same as the length l of the manifold 100. However, in the embodiment shown in FIGS. 6A-6J, the length of the gas pathway defined by the bore 130 from the inlet 120, through the upstream axial portion 130A, through the extended length mixing pathway 180, and through the downstream axial portion 130B may be greater than the length l defined between the inlet 120 and outlet 132 (e.g., between the first and second end portions of the manifold 100).

Figure 7A:
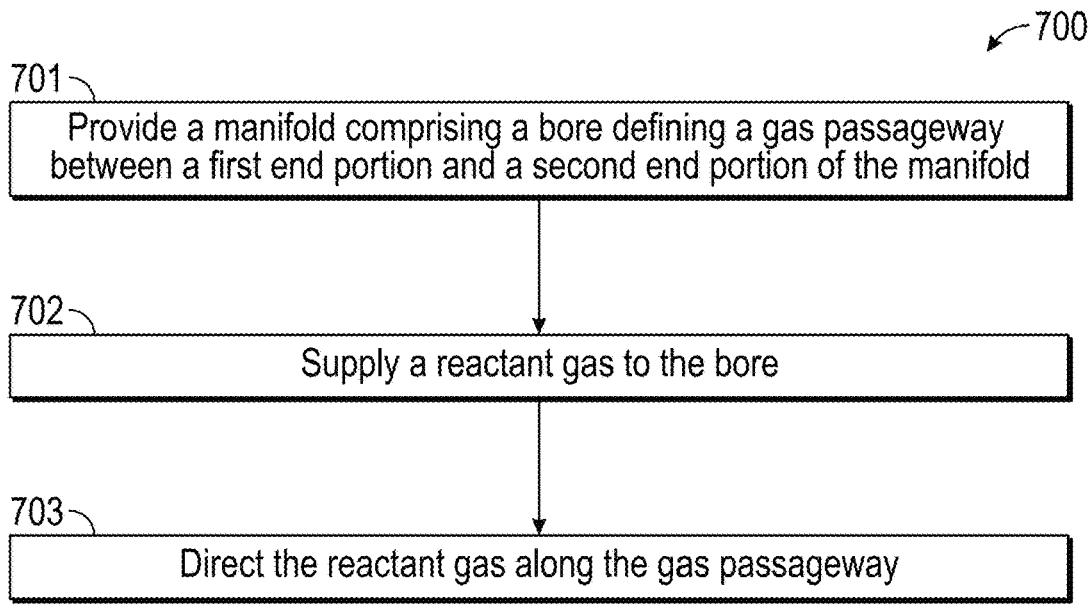
FIGS. 7A and 7B are flowcharts illustrating example deposition methods, according to various embodiments.

FIG. 7A is a flowchart illustrating a method 700 for depositing one or more layers on a substrate. The method 700 begins in a block 701 to provide a manifold comprising a bore therein. The bore can define a gas passageway between a first end portion of the manifold and a second end portion of the manifold. The first end portion can be disposed opposite to and spaced from the second end portion along a longitudinal axis of the manifold by a first distance. In various embodiments, the first end portion of the manifold can comprise the end portion at which an inert gas inlet is disposed. The second end portion can comprise the end portion at which the outlet is disposed.

Turning to a block 702, a reactant gas can be supplied to the bore. In some embodiments, the reactant gas can be supplied to a distribution channel from a gas source. The gas can be conveyed to the bore by way of one or more supply channels extending form the distribution channel to the bore. In some embodiments, the supply channel can comprise a slit defining an at least partially annular gap through an inner wall of the bore. In other embodiments, the supply channels can comprise angled passageways that angle inwardly from the distribution channel to the bore at an acute angle.

In a block 703, the reactant gas can be directed along the gas passageway from the first end portion to the second end portion for a second distance. The second distance can be larger than the first distance. As explained herein, in some embodiments, the reactant gas can be directed along a first lateral portion extending non-parallel to and away from the longitudinal axis of the manifold. An offset axial portion of the pathway can convey the gas along the longitudinal axis. A second lateral portion can extend non-parallel to and towards the longitudinal axis of the manifold. In some arrangements, a downstream axial portion of the bore can convey the mixed gases to the reaction chamber. Advantageously, as explained herein, the extended mixing length can improve mixing and reduce non-uniformities of deposition processes.

Figure 7B:
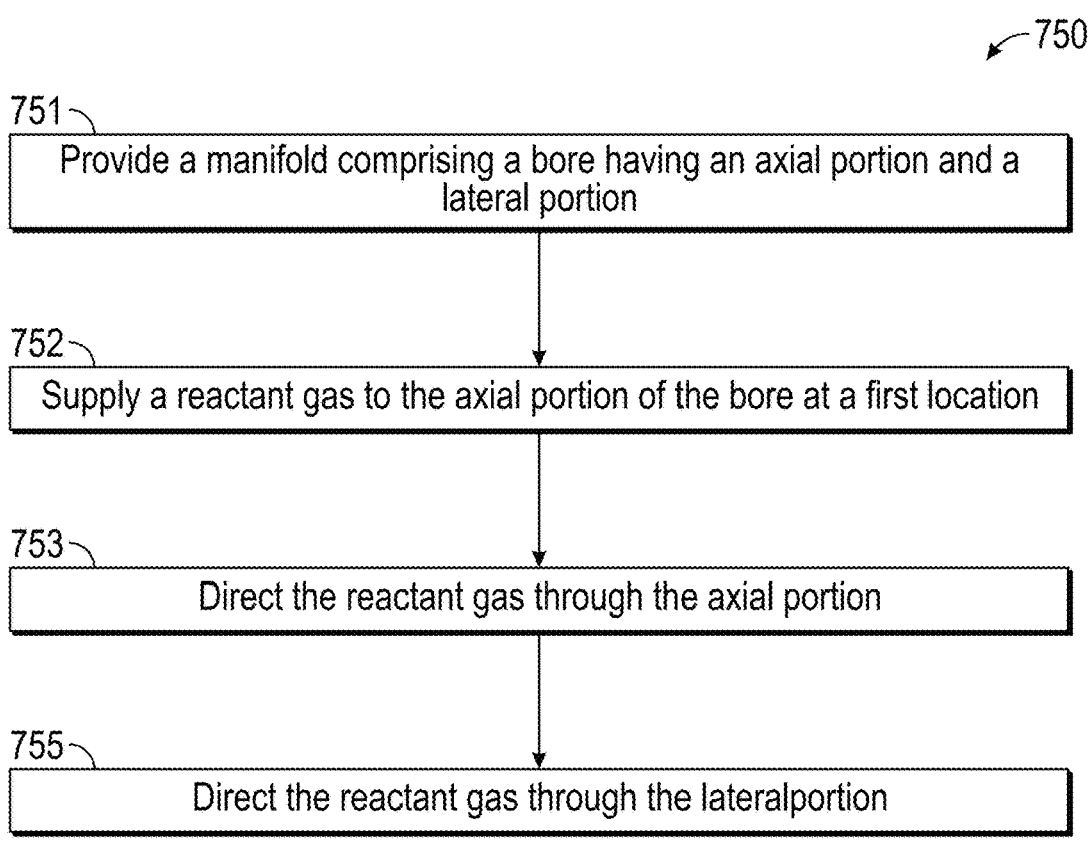

FIG. 7B is a flowchart illustrating a method 750 for depositing one or more layers on a substrate, according to various embodiments. In a block 751, a manifold comprising a bore can be provided. The bore can comprise an axial portion that defines a longitudinal axis of the manifold and a lateral portion extending non-parallel to the longitudinal axis. In a block 752, a reactant gas can be supplied to the axial portion of the bore at a first location along the longitudinal axis. For example, as explained above, the gas can be supplied to the axial portion by way of a supply channel comprising a slit. In other embodiments, the gas can be supplied to the axial portion by way of one or more angled supply channels.

In a block 752, the reactant gas can be directed through the axial portion of the bore parallel to the longitudinal axis. In a block 753, downstream of the axial portion, the reactant gas can be directed through the lateral portion of the bore in a direction non-parallel to the longitudinal axis. In some embodiments, the gas can pass from the lateral portion into an offset axial portion of the bore in a direction parallel to (or including a directional component parallel to) the longitudinal axis. As explained herein, a second lateral portion can extend laterally towards the longitudinal axis to convey the gas from the offset axial portion to a downstream axial portion. The gas can be conveyed along the downstream axial portion to the reaction chamber.

IV. Manifolds with Single Gas Supply Tier

Various embodiments disclosed herein relate to manifolds 100 with a single reactant supply channel for each reactant gas to be supplied to the bore 100. For example, a semiconductor processing device can comprise a manifold comprising a bore defining an inner wall and a channel through the manifold. The device can include a source of a reactant gas. A supply channel can be configured to deliver the reactant gas to the bore by way of an opening on the inner wall of the bore. All the reactant gas can be delivered to the bore by the opening.

Figure 8A:
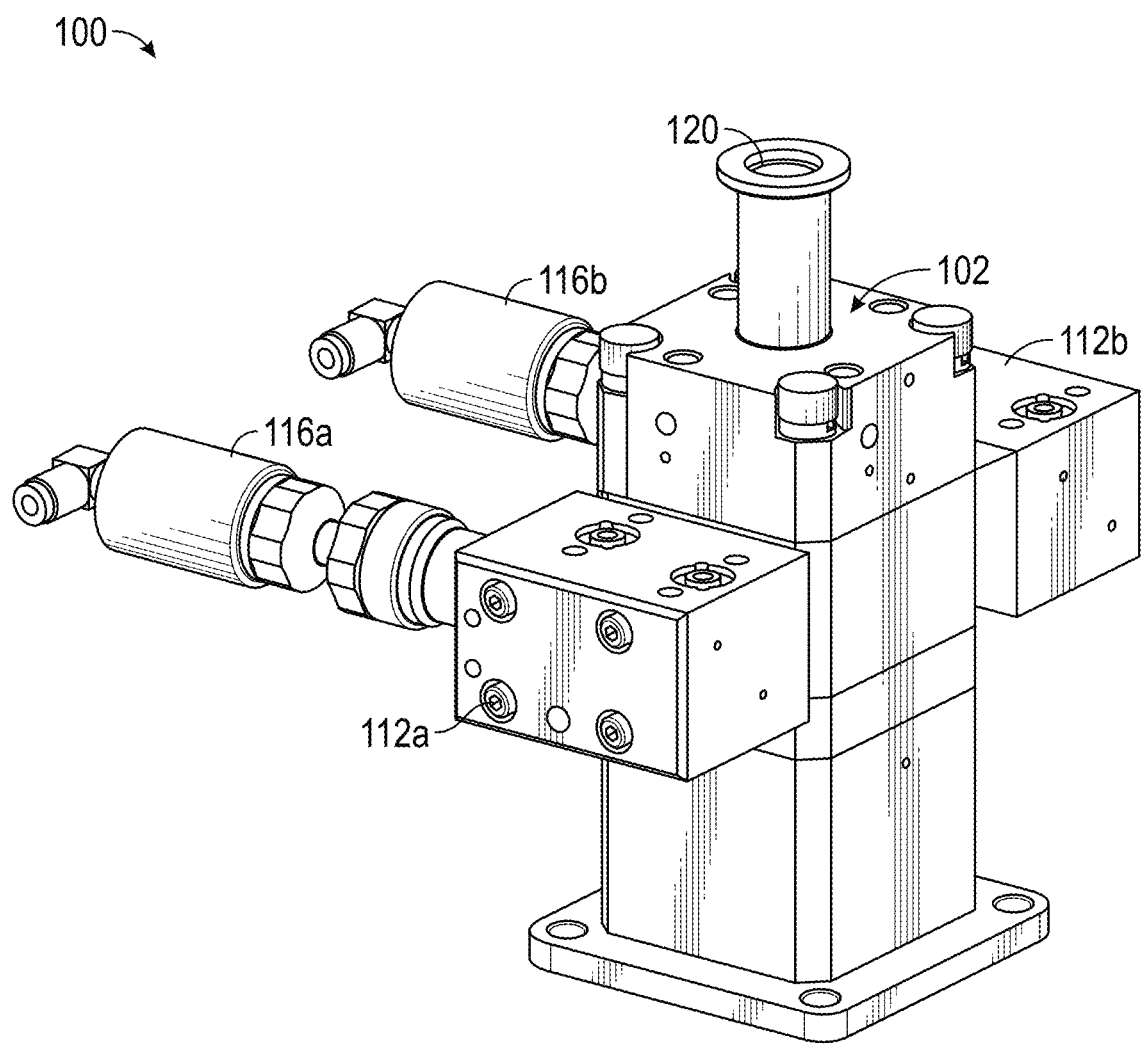
FIGS. 8A-8F illustrate various embodiments of a semiconductor processing device in which a single supply tier supplies gas to the bore.

FIG. 8A is a schematic perspective view of a manifold 100 that includes a single tier of gas delivery to the bore 130. Unless otherwise noted, reference numerals in FIGS. 8A-8F represent components that are the same as or similar to like numbered components in FIGS. 1-7B. For example, as shown in FIG. 8A, the manifold 100 can comprise a manifold body 102 connected with two blocks 112a, 112b. First and second valves 116a, 116b (e.g., reactant gas valves) may be disposed on the blocks 112a, 112b. The inert gas inlet 120 can supply inert gas to the bore 130.

Figure 8B:
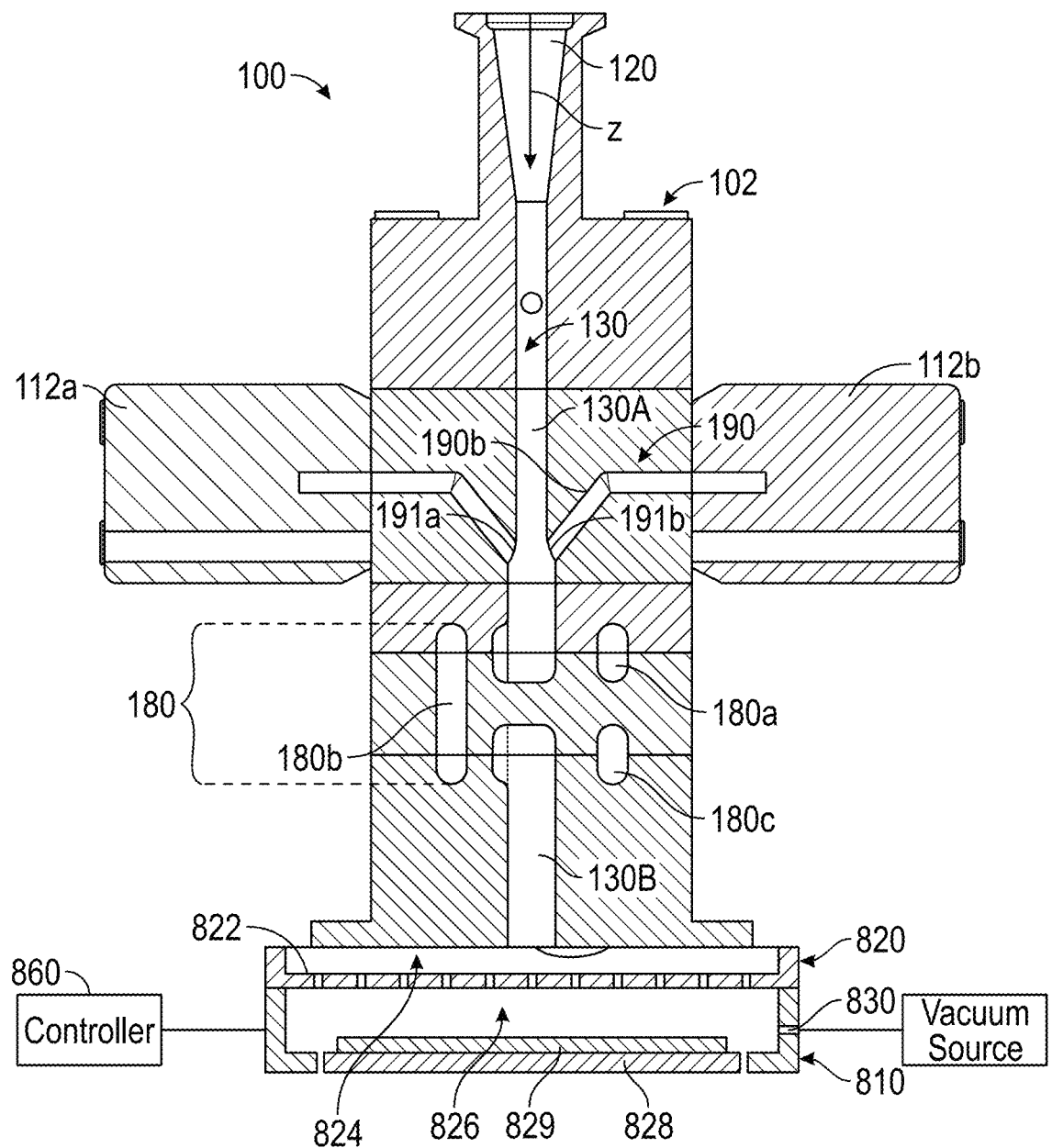
Figure 8C:
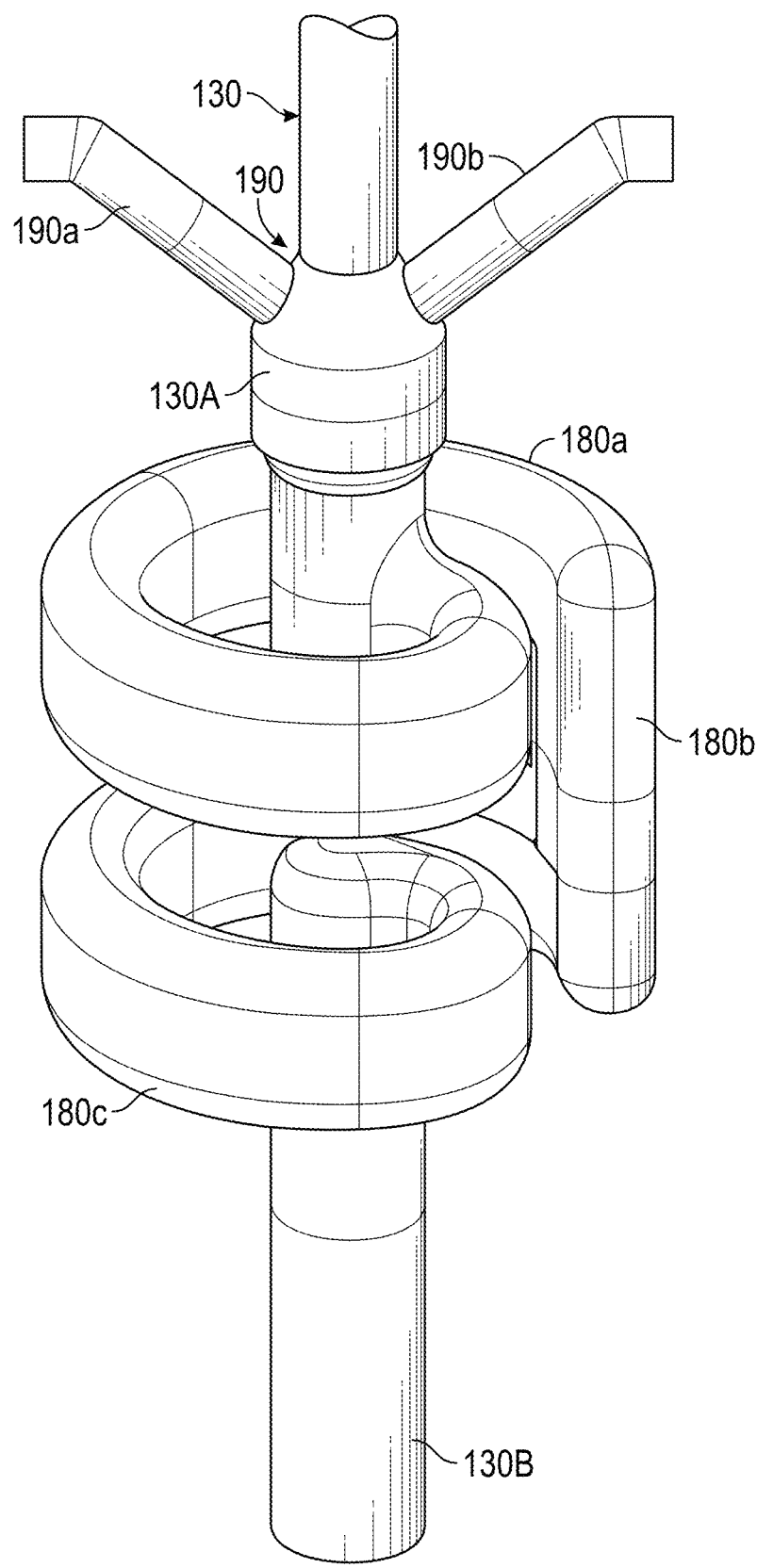

FIG. 8B is a schematic side cross-sectional view of a semiconductor processing device 10 comprising the manifold 10 of FIG. 8A and the reaction chamber 810. FIG. 8C illustrates the flow pathway of the gases through the manifold 100 of FIG. 8B. As with the embodiment of FIGS. 6A-6J, the manifold 100 can comprise an upstream axial flow portion 130A, an extended mixing length passageway 180, and a downstream axial flow portion 130B. In addition, the pathway 180 can comprise a first lateral portion 180a, an offset axial portion 180b, and a second lateral portion 180c. Beneficially, the pathway 180 can extend the mixing length downstream of the location at which the gases enter the bore 130. The extended mixing length can improve the mixing of supplied gases to improve uniformity and device yield.

The extended mixing length provided by the pathway 180 can also advantageously enable the use of a single gas supply tier 190. Unlike the embodiments of FIGS. 2-6J, in which the gases are supplied along multiple tiers spaced apart along the longitudinal axis Z, in the embodiment of FIGS. 8B-8C, the supply tier 190 can comprise a first supply channel 190a and a second supply channel 190b that delivers gases to the bore 130 by way of corresponding openings 191a, 191b in the inner wall of the manifold 100. The first and second supply channels 190a, 190b can be disposed opposite one another at approximately the same axial location. In other arrangements, disposing the supply channels in a spaced relationship along the bore 130 can improve mixing. However, in FIGS. 8B-8C, the extended mixing length provided by the pathway 180 can enable use of the first supply channel 190a to supply all the reactant gas provided to the manifold 100 by a corresponding first gas source. Similarly, the second supply channel 190b can supply all the reactant gas provided to the manifold 100 by a second gas source. Thus, all the first gas can pass through the first supply channel 190a and first opening 191a to the bore 130, e.g., to the upstream axial portion 130A. All the second gas can pass through the second supply channel 190b and second opening 191b to the bore 130, e.g., to the upstream axial portion 130A of the bore 130.

Figure 8D:
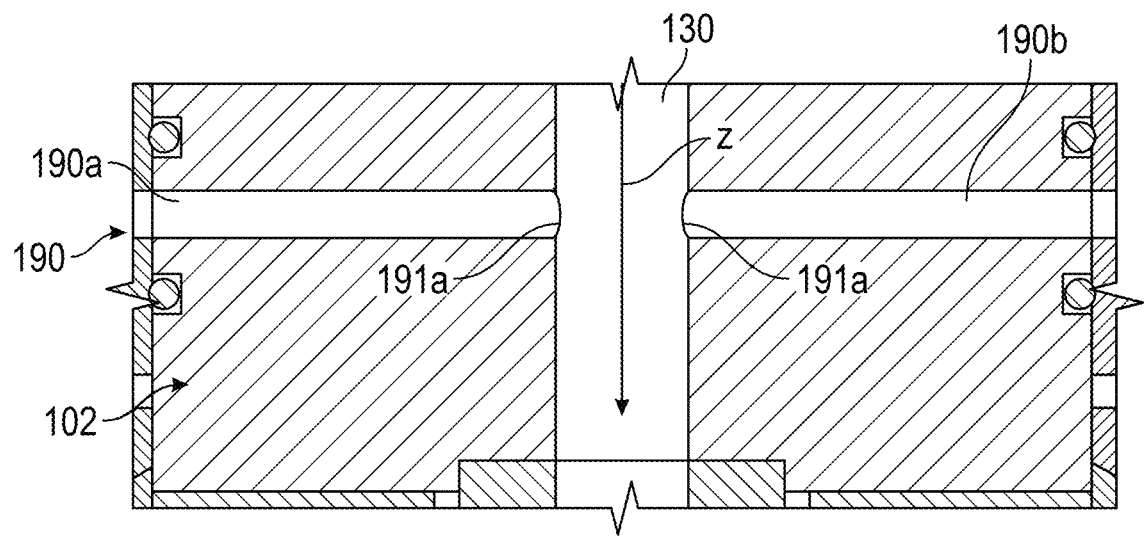
Figure 8E:
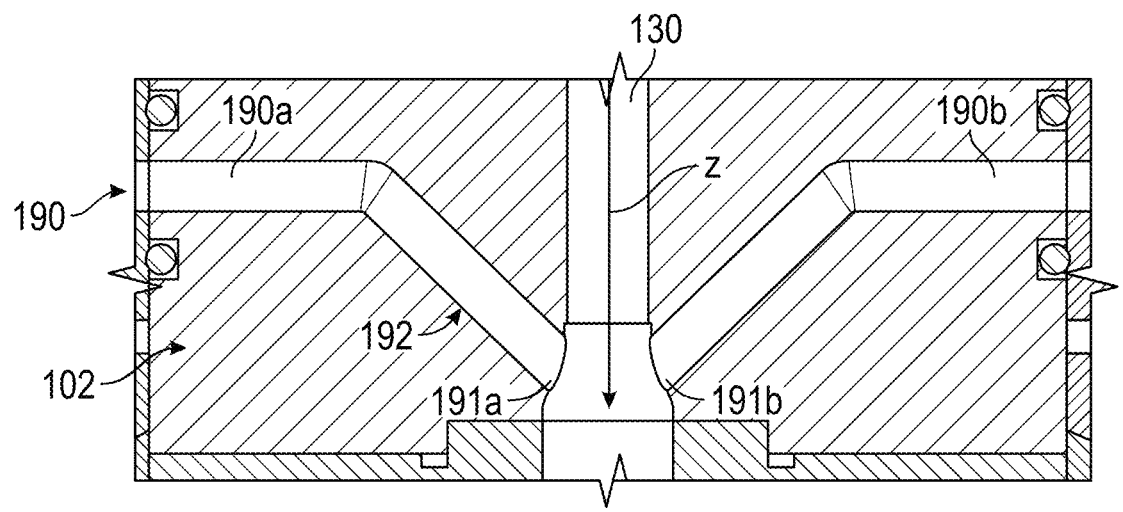
Figure 8F:
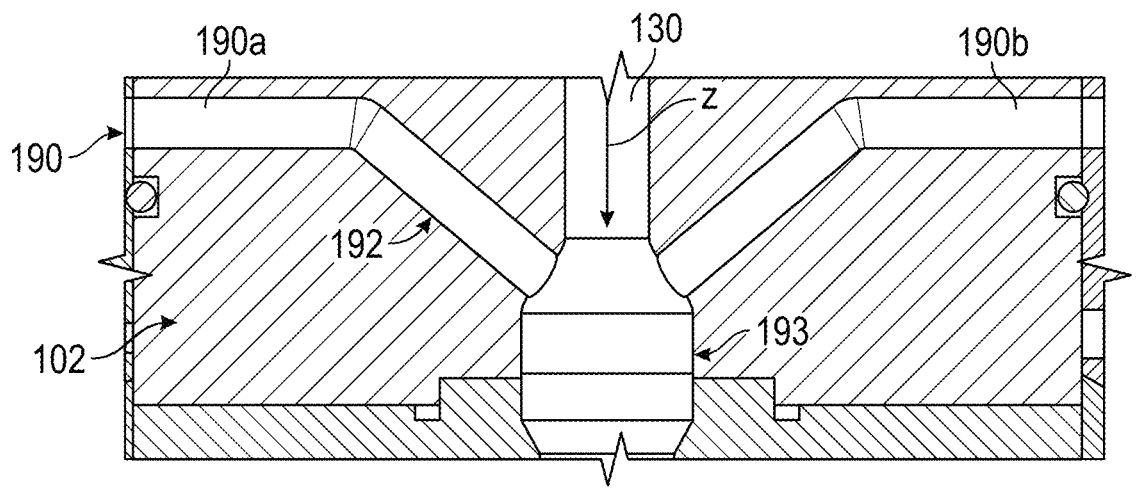

FIGS. 8D-8F are schematic side cross-sectional views of the supply tier 190 shown in FIGS. 8B-8C, according to various embodiments. In FIG. 8D, the gas supply tier 190 comprises first and second supply channels 190a, 190b that extend non-parallel to the longitudinal axis Z, e.g., the supply channels 190a, 190b are disposed perpendicular to the axis Z. Gas flows through the openings 191a, 191b to the bore 130, and are conveyed axially along the axis Z to the extended mixing pathway 180 and the reaction chamber 810. In FIG. 8D, the supply channels 190a, 190b extend horizontally such that the channels 190a, 190b are perpendicular to the bore 130. Such an arrangement can advantageously simplify manufacturing processes as compared with manifolds that utilize angled channels. The extended mixing length pathway 180 can facilitate downstream mixing of the supplied gases.

FIG. 8E illustrates first and second supply channels 190a, 190b that have downwardly-angled portions 192 that convey the gases to the bore 130. Angling the portions 192 along the axis Z can beneficially enhance mixing in the axial portion 130A of the bore 130. In FIG. 8F, the angled portions 192 enter the bore 130 upstream of an expanded bore portion 193 that has a larger diameter than the portion of the bore 130 upstream of the expanded portion 193. The expanded portion 193 can comprise a mixing chamber in the bore 130 in which the supplied gases can mix together.

Figure 9:
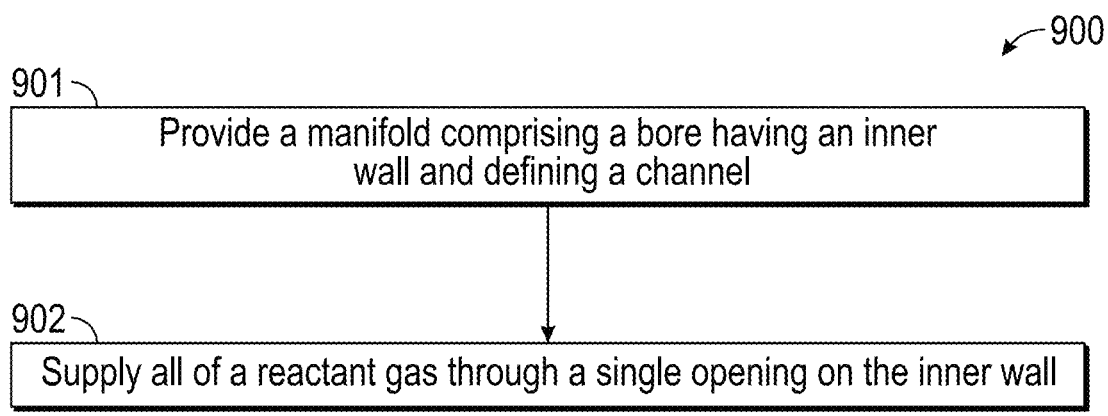
FIG. 9 is a flowchart illustrating an example deposition method, according to various embodiments.

FIG. 9 is a flowchart illustrating a method 900 of depositing one or more films on a substrate, according to various embodiments. In a block 901, a manifold can be provided. The manifold can comprise a bore having an inner wall and defining a channel through the manifold. In a block 902, all of a reactant gas can be supplied through the single opening on the inner wall of the bore. As explained herein, the use of a single gas supply tier can simplify manufacturing of the manifold. For example, a second supply channel and a second opening can be disposed at the same axial position as the single opening and a first supply channel that supplies gas to the single opening.

Although the foregoing has been described in detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention. Moreover, not all of the features, aspects and advantages described herein above are necessarily required to practice the present invention.

What is claimed is:

1. A semiconductor processing device comprising:
a manifold comprising a bore having an extended length configured for mixing a plurality of gases therein along a gas passageway, the bore comprising:
an axial portion that defines a longitudinal axis of the manifold;
a lateral portion extending non-parallel to the longitudinal axis from a first end of the axial portion, the lateral portion at least partially revolved about an axis having a component parallel to the longitudinal axis;
an offset axial portion extending downstream from a second end of the lateral portion and having a directional component along the longitudinal axis, the offset axial portion disposed laterally offset from the longitudinal axis; and
a second lateral portion extending non-parallel to the longitudinal axis from a third end of the offset axial portion, the second lateral portion disposed downstream of the lateral portion,
wherein the gas passageway passes through the axial portion, the lateral portion, the offset axial portion, and the second lateral portion of the bore,
wherein an entirety of the gas passageway passes through the lateral portion, the offset axial portion, and the second lateral portion of the bore, and
wherein the lateral portion, the offset axial portion, and the second lateral portion include only a single channel along which the entirety of the gas passageway passes;
a supply channel that supplies gas to the axial portion of the bore at a first location along the longitudinal axis, the lateral portion disposed at a second location downstream of the first location; and
a reaction chamber disposed downstream of and in fluid communication with the bore.

2. The device of claim 1, further comprising a substrate support configured to support a substrate.

3. The device of claim 1, further comprising a showerhead configured to disperse gas to the reaction chamber.

4. The device of claim 1, further comprising a gas distribution channel that conveys gas from a gas source to the bore by way of the supply channel.

5. The device of claim 4, further comprising a reactant gas valve configured to selectively transfer the gas to the gas distribution channel.

6. The device of claim 1, further comprising a downstream axial portion having a directional component along the longitudinal axis, the downstream axial portion providing fluid communication between the second lateral portion and the reaction chamber.

7. The device of claim 1, wherein the lateral portion is disposed in a spiral pattern relative to the axis having the component parallel to the longitudinal axis.

8. The device of claim 1, wherein the lateral portion comprises a curved channel.

9. The device of claim 1, wherein the semiconductor processing device comprises an atomic layer deposition (ALD) device.

10. The device of claim 1, wherein the bore defines the gas passageway between a first end portion of the manifold and a second end portion of the manifold, the first end portion disposed opposite to and spaced from the second end portion along the longitudinal axis of the manifold by a first distance, wherein the gas passageway extends through the manifold for a second distance larger than the first distance.

11. The device of claim 10, wherein the gas passageway comprises the axial portion and the lateral portion.

12. The device of claim 1, further comprising an inert gas line configured to transport an inert gas to the bore.

13. The device of claim 12, further comprising an inert gas valve configured to selectively transfer the inert gas to the inert gas line.

14. The device of claim 1, wherein the supply channel is disposed at an angle to the bore.

15. The device of claim 1, wherein the supply channel comprises a slit defining an at least partially annular gap about the longitudinal axis.

16. The device of claim 1, further comprising a first block having a first groove defined in a first surface of the first block, wherein the lateral portion of the bore is defined at least in part by the first groove of the first block.

17. The device of claim 16, further comprising a second block having a second groove defined in a second surface of the second block, wherein first surface of the first block is mechanically connected to the second surface of the second block, the first and second grooves cooperating to at least partially define the lateral portion of the bore.

18. The device of claim 1, wherein the manifold provides a mixing non-uniformity of less than 2%.

19. The device of claim 1, wherein the offset axial portion is the only fluid pathway that connects the lateral portion with the second lateral portion of the bore.

20. A semiconductor processing device comprising:
a manifold comprising a bore having an extended length configured for mixing a plurality of gases therein along a gas passageway, the bore comprising:
an axial portion that defines a longitudinal axis of the manifold;
a first block having a first groove defined in a first surface of the first block;
a second block having a second groove defined in a second surface of the second block, wherein the first surface of the first block is mechanically connected to the second surface of the second block, the first and second grooves cooperating to at least partially define a lateral portion of the bore, the lateral portion extending non-parallel to the longitudinal axis from a first end of the axial portion, the lateral portion at least partially revolved about an axis having a component parallel to the longitudinal axis;
an offset axial portion extending downstream from a second end of the lateral portion and having a directional component along the longitudinal axis, the offset axial portion disposed laterally offset from the longitudinal axis; and
a second lateral portion extending non-parallel to the longitudinal axis from a third end of the offset axial portion, the second lateral portion disposed downstream of the lateral portion,
wherein the gas passageway passes through the axial portion, the lateral portion, the offset axial portion, and the second lateral portion of the bore, and
wherein the lateral portion, the offset axial portion, and the second lateral portion include only a single channel along which the gas passageway passes;
a supply channel that supplies gas to the axial portion of the bore at a first location along the longitudinal axis, the lateral portion disposed at a second location downstream of the first location; and
a reaction chamber disposed downstream of and in fluid communication with the bore.

21. The device of claim 20, wherein the offset axial portion is the only fluid pathway that connects the lateral portion with the second lateral portion of the bore.

22. The device of claim 20, further comprising a downstream axial portion having a directional component along the longitudinal axis, the downstream axial portion providing fluid communication between the second lateral portion and the reaction chamber.

* * * * *